US009906318B2

(12) United States Patent
Zuo et al.

(10) Patent No.: US 9,906,318 B2
(45) Date of Patent: Feb. 27, 2018

(54) FREQUENCY MULTIPLEXER

(71) Applicant: QUALCOMM Incorporated, San Diego, CA (US)

(72) Inventors: Chengjie Zuo, Santee, CA (US); Daeik Daniel Kim, San Diego, CA (US); David Francis Berdy, San Diego, CA (US); Changhan Hobie Yun, San Diego, CA (US); Je-Hsiung Jeffrey Lan, San Diego, CA (US); Robert Paul Mikulka, Oceanside, CA (US); Mario Francisco Velez, San Diego, CA (US); Jonghae Kim, San Diego, CA (US); Matthew Michael Nowak, San Diego, CA (US); Ryan Scott C. Spring, San Diego, CA (US); Xiangdong Zhang, Westford, MA (US)

(73) Assignee: QUALCOMM Incorporated, San Diego, CA (US)

( * ) Notice: Subject to any disclaimer, the term of this patent is extended or adjusted under 35 U.S.C. 154(b) by 26 days.

(21) Appl. No.: 14/682,023

(22) Filed: Apr. 8, 2015

(65) Prior Publication Data

US 2015/0304059 A1    Oct. 22, 2015

Related U.S. Application Data

(60) Provisional application No. 61/981,538, filed on Apr. 18, 2014.

(51) Int. Cl.
*H04J 1/00* (2006.01)
*H04J 1/08* (2006.01)
(Continued)

(52) U.S. Cl.
CPC ............... *H04J 1/08* (2013.01); *H03H 7/465* (2013.01); *H04B 1/006* (2013.01); *H04B 1/0057* (2013.01);
(Continued)

(58) Field of Classification Search
CPC ....... H04J 1/08; H03H 7/465; H03H 2240/00; H03H 2250/00; H04B 1/0057; H04B 1/006; H04B 1/0064
See application file for complete search history.

(56) References Cited

U.S. PATENT DOCUMENTS 3,798,059 A    3/1974  Astle et al.
4,815,128 A    3/1989  Malek
(Continued)

FOREIGN PATENT DOCUMENTS

CN    1628360 A    6/2005
CN    1893071 A    1/2007
(Continued)

OTHER PUBLICATIONS

Lianjun Liu et al., "Compact Harmonic Filter Design and Fabrication Using IPD Technology", IEEE Transactions on components and packaging technologies, vol. 30, No. 4, 2007.*
(Continued)

*Primary Examiner* — Lonnie Sweet
(74) *Attorney, Agent, or Firm* — Qualcomm Incorporated-Toler

(57) ABSTRACT

An apparatus is disclosed that includes a frequency multiplexer circuit coupled to an input node and configured to receive an input signal via the input node. The frequency multiplexer circuit comprises a first filter circuit, a second filter circuit, and a third filter circuit. The apparatus also includes a switching circuit that is configurable to couple at least two of a first output of the first filter circuit, a second
(Continued)

output of the second filter circuit, or a third output of the third filter circuit to a single output port.

24 Claims, 13 Drawing Sheets

(51) Int. Cl.
  *H03H 7/46* (2006.01)
  *H04B 1/00* (2006.01)
(52) U.S. Cl.
  CPC ....... *H04B 1/0064* (2013.01); *H03H 2240/00* (2013.01); *H03H 2250/00* (2013.01)

(56) References Cited

U.S. PATENT DOCUMENTS

| | | |
|---|---|---|
| 4,816,784 A | 3/1989 | Rabjohn |
| 4,841,253 A | 6/1989 | Crabill |
| 5,015,972 A | 5/1991 | Cygan et al. |
| 5,038,104 A | 8/1991 | Wikswo, Jr. et al. |
| 5,095,357 A | 3/1992 | Andoh et al. |
| 5,111,169 A | 5/1992 | Ikeda |
| 5,161,082 A | 11/1992 | Alfonso |
| 5,719,073 A | 2/1998 | Shaw et al. |
| 5,831,331 A | 11/1998 | Lee |
| 5,959,846 A | 9/1999 | Noguchi et al. |
| 5,986,617 A | 11/1999 | McLellan |
| 6,025,261 A | 2/2000 | Farrar et al. |
| 6,169,470 B1 | 1/2001 | Ibata et al. |
| 6,429,763 B1 | 8/2002 | Patel et al. |
| 6,437,965 B1 | 8/2002 | Adkins et al. |
| 6,466,768 B1* | 10/2002 | Agahi-Kesheh ....... H04B 1/005 330/133 |
| 6,501,363 B1 | 12/2002 | Hwu et al. |
| 6,580,350 B1 | 6/2003 | Kobayashi |
| 6,603,382 B1 | 8/2003 | Komai et al. |
| 6,649,998 B2 | 11/2003 | Song |
| 6,714,112 B2 | 3/2004 | Beng et al. |
| 6,801,114 B2 | 10/2004 | Yang et al. |
| 6,816,784 B1 | 11/2004 | Khan et al. |
| 6,870,457 B2 | 3/2005 | Chen et al. |
| 6,985,035 B1 | 1/2006 | Khorramabadi |
| 6,990,729 B2 | 1/2006 | Pleskach et al. |
| 7,064,411 B2 | 6/2006 | Hashizume et al. |
| 7,304,558 B1 | 12/2007 | Pleskach et al. |
| 7,312,685 B1 | 12/2007 | Lee |
| 7,370,403 B1 | 5/2008 | Hsu et al. |
| 7,486,168 B2 | 2/2009 | Kim |
| 7,526,256 B2 | 4/2009 | Bhatti et al. |
| 7,570,129 B2 | 8/2009 | Kintis et al. |
| 7,592,891 B2 | 9/2009 | Hsu et al. |
| 7,616,934 B2 | 11/2009 | MacPhail |
| 7,619,297 B2 | 11/2009 | Wang |
| 7,808,358 B2 | 10/2010 | Nakamura et al. |
| 7,894,205 B2 | 2/2011 | Lee et al. |
| 8,013,708 B2 | 9/2011 | Tsai |
| 8,045,946 B2 | 10/2011 | Roo et al. |
| 8,229,367 B2 | 7/2012 | Chan et al. |
| 8,233,870 B2 | 7/2012 | Walley et al. |
| 8,339,233 B2 | 12/2012 | Tsai et al. |
| 8,354,325 B1 | 1/2013 | Dao et al. |
| 8,368,481 B2 | 2/2013 | Jin et al. |
| 8,493,126 B2 | 7/2013 | Sankaranarayanan et al. |
| 8,591,262 B2 | 11/2013 | Schaffer et al. |
| 9,001,031 B2 | 4/2015 | Lo et al. |
| 2002/0057176 A1 | 5/2002 | Norstrom et al. |
| 2002/0113682 A1 | 8/2002 | Gevorgian et al. |
| 2002/0132383 A1 | 9/2002 | Hiroki et al. |
| 2003/0151485 A1 | 8/2003 | Lewis |
| 2004/0012474 A1 | 1/2004 | Hwu et al. |
| 2004/0090298 A1 | 5/2004 | Masu et al. |
| 2004/0104449 A1 | 6/2004 | Yoon et al. |
| 2004/0150502 A1 | 8/2004 | Jacobson et al. |
| 2004/0207504 A1 | 10/2004 | Yang et al. |
| 2005/0104158 A1 | 5/2005 | Bhattacharjee et al. |
| 2006/0017539 A1 | 1/2006 | Lee et al. |
| 2006/0284719 A1 | 12/2006 | Lee |
| 2007/0008058 A1 | 1/2007 | Hashimoto |
| 2007/0030116 A1 | 2/2007 | Feher |
| 2007/0152298 A1 | 7/2007 | Kim |
| 2007/0176845 A1 | 8/2007 | Yamazaki et al. |
| 2007/0188997 A1 | 8/2007 | Hockanson et al. |
| 2007/0247269 A1 | 10/2007 | Papananos |
| 2007/0249078 A1 | 10/2007 | Tung et al. |
| 2008/0037590 A1 | 2/2008 | Aiga et al. |
| 2008/0076354 A1 | 3/2008 | Rofougaran |
| 2008/0169895 A1 | 7/2008 | Lee |
| 2008/0174386 A1* | 7/2008 | Ono ..................... H01P 1/2135 333/132 |
| 2008/0174396 A1 | 7/2008 | Choi et al. |
| 2008/0174397 A1 | 7/2008 | De Rooij et al. |
| 2008/0246114 A1 | 10/2008 | Abrokwah et al. |
| 2008/0272875 A1 | 11/2008 | Huang et al. |
| 2008/0303622 A1 | 12/2008 | Park et al. |
| 2009/0001510 A1 | 1/2009 | Matz et al. |
| 2009/0072404 A1 | 3/2009 | Kikuchi et al. |
| 2009/0085708 A1 | 4/2009 | Matsumoto et al. |
| 2009/0146770 A1 | 6/2009 | Lee et al. |
| 2009/0243389 A1 | 10/2009 | Edo et al. |
| 2009/0243749 A1 | 10/2009 | Rofougaran |
| 2009/0322447 A1 | 12/2009 | Daley et al. |
| 2010/0060402 A1 | 3/2010 | Chen |
| 2010/0096753 A1 | 4/2010 | Hwang et al. |
| 2010/0109123 A1 | 5/2010 | Strzalkowski et al. |
| 2010/0148866 A1 | 6/2010 | Lee et al. |
| 2010/0164667 A1 | 7/2010 | Ho-Hsiang |
| 2010/0182118 A1 | 7/2010 | Roskos et al. |
| 2010/0225435 A1 | 9/2010 | Li et al. |
| 2010/0231305 A1 | 9/2010 | Mizokami et al. |
| 2010/0260082 A1* | 10/2010 | Lum ..................... H04B 1/0057 370/297 |
| 2010/0270947 A1 | 10/2010 | Chang et al. |
| 2011/0018670 A1 | 1/2011 | Bae et al. |
| 2011/0050357 A1* | 3/2011 | Kim ..................... H01L 23/5227 333/32 |
| 2011/0102124 A1 | 5/2011 | Matsushita |
| 2011/0133875 A1 | 6/2011 | Chiu et al. |
| 2011/0133879 A1 | 6/2011 | Chiu et al. |
| 2011/0168997 A1 | 7/2011 | Lee et al. |
| 2011/0210804 A1 | 9/2011 | Uemichi et al. |
| 2011/0217657 A1 | 9/2011 | Flemming et al. |
| 2011/0221560 A1 | 9/2011 | Chen et al. |
| 2011/0229667 A1 | 9/2011 | Jin et al. |
| 2011/0229687 A1 | 9/2011 | Gu et al. |
| 2011/0234469 A1* | 9/2011 | Shoji ..................... H01Q 21/28 343/852 |
| 2011/0245948 A1 | 10/2011 | Bai et al. |
| 2011/0291786 A1 | 12/2011 | Li et al. |
| 2011/0299431 A1 | 12/2011 | Mikhemar et al. |
| 2011/0299435 A1 | 12/2011 | Mikhemar et al. |
| 2011/0304013 A1 | 12/2011 | Chen et al. |
| 2012/0058676 A1 | 3/2012 | Schaffer et al. |
| 2012/0075216 A1 | 3/2012 | Black et al. |
| 2012/0146741 A1 | 6/2012 | Yen et al. |
| 2012/0188047 A1 | 7/2012 | Groves et al. |
| 2012/0194403 A1 | 8/2012 | Cordier et al. |
| 2012/0235779 A1 | 9/2012 | Baram et al. |
| 2012/0235969 A1 | 9/2012 | Burns et al. |
| 2012/0238331 A1 | 9/2012 | Dou et al. |
| 2012/0244802 A1 | 9/2012 | Feng et al. |
| 2012/0249186 A1 | 10/2012 | Chen |
| 2012/0249281 A1 | 10/2012 | Campbell et al. |
| 2012/0293485 A1 | 11/2012 | Chang et al. |
| 2012/0299166 A1 | 11/2012 | Minamio et al. |
| 2013/0016633 A1 | 1/2013 | Lum et al. |
| 2013/0039229 A1 | 2/2013 | Park et al. |
| 2013/0050226 A1 | 2/2013 | Shenoy et al. |
| 2013/0057343 A1 | 3/2013 | Kondo |
| 2013/0057557 A1* | 3/2013 | Shenoy ................. B81C 1/0038 345/501 |
| 2013/0106554 A1 | 5/2013 | Girard et al. |
| 2013/0157717 A1* | 6/2013 | Yu ........................... H04B 1/44 455/553.1 |

(56) References Cited

U.S. PATENT DOCUMENTS

| | | |
|---|---|---|
| 2013/0207276 A1 | 8/2013 | Tseng et al. |
| 2013/0207739 A1 | 8/2013 | Bakalski |
| 2013/0207745 A1 | 8/2013 | Yun et al. |
| 2013/0257367 A1 | 10/2013 | Someya |
| 2013/0278374 A1 | 10/2013 | Thorslund |
| 2014/0138792 A1 | 5/2014 | Lo et al. |
| 2014/0145810 A1 | 5/2014 | Park et al. |
| 2014/0197902 A1 | 7/2014 | Zuo et al. |
| 2014/0225702 A1 | 8/2014 | Yazaki |
| 2014/0227982 A1 | 8/2014 | Granger-Jones et al. |
| 2014/0240072 A1 | 8/2014 | Lan et al. |
| 2014/0266494 A1 | 9/2014 | Lan et al. |
| 2014/0293841 A1 | 10/2014 | Rousu |
| 2014/0307599 A1* | 10/2014 | Rousu .................. H04B 1/006 370/297 |
| 2014/0327510 A1 | 11/2014 | Kim et al. |
| 2015/0061813 A1 | 3/2015 | Kim et al. |
| 2015/0092314 A1 | 4/2015 | Kim et al. |
| 2015/0130579 A1 | 5/2015 | Kim et al. |
| 2015/0194944 A1 | 7/2015 | Joshi et al. |
| 2016/0358709 A1 | 12/2016 | Kim et al. |
| 2017/0134007 A1 | 5/2017 | Lan et al. |

FOREIGN PATENT DOCUMENTS

| | | |
|---|---|---|
| CN | 101213142 A | 7/2008 |
| CN | 101241916 A | 8/2008 |
| CN | 201156721 Y | 11/2008 |
| CN | 101673864 A | 3/2010 |
| CN | 101960573 A | 1/2011 |
| CN | 102231313 A | 11/2011 |
| CN | 102522181 A | 6/2012 |
| CN | 102725844 A | 10/2012 |
| CN | 102739229 A | 10/2012 |
| CN | 203942319 U | 11/2014 |
| EP | 0468757 A2 | 1/1992 |
| EP | 0995264 A1 | 4/2000 |
| EP | 1085538 A1 | 3/2001 |
| EP | 1443529 A1 | 8/2004 |
| EP | 1729413 A1 | 12/2006 |
| JP | H0832076 A | 2/1996 |
| JP | H08148354 A | 6/1996 |
| JP | 2000286125 A | 10/2000 |
| JP | 2002152901 A | 5/2002 |
| JP | 2003031814 A | 1/2003 |
| JP | 2003318417 A | 11/2003 |
| JP | 2004235584 A | 8/2004 |
| JP | 2005032976 A | 2/2005 |
| JP | 2005223261 A | 8/2005 |
| JP | 2006054446 A | 2/2006 |
| JP | 2009508322 A | 2/2009 |
| JP | 2009071045 A | 4/2009 |
| JP | 2010141246 A | 6/2010 |
| JP | 2012058274 A | 3/2012 |
| JP | 2012074060 A | 4/2012 |
| KR | 20080031153 A | 4/2008 |
| KR | 20080069823 A | 7/2008 |
| KR | 101127478 B1 | 3/2012 |
| KR | 20130072284 A | 7/2013 |
| KR | 20130098099 A | 9/2013 |
| WO | 02080279 A1 | 10/2002 |
| WO | 2013033124 A1 | 3/2013 |

OTHER PUBLICATIONS

Swapan K. Bhattacharya et al., "Fabrication of a fully integrated passive module for filter application using MCM-D compatible processes", Journal of Materia.*

Bae, Hagyoul, et al., "Extraction of Separated Source and Drain Resistances in Amorphous Indium-Gallium-Zinc Oxide TFTs Through C-V Characterization," IEEE Electron Device Letters, Jun. 2011, vol. 32, No. 6, IEEE, Piscataway, NJ, pp. 761-763.

International Search Report and Written Opinion for International Application No. PCT/US2015/025193, ISA/EPO, dated Jan. 12, 2016, 13 pgs.

Saputra N., et al., "Single-Grain Si Thin-Film Transistors for Analog and RF Circuit Applications", Solid State Circuits Conference, Sep. 11-13, 2007, IEEE, Piscataway, NJ, pp. 107-110.

Chen, Chien-Hsun et al., "Very Compact Transformer-Coupled Balun-Integrated Bandpass Filter Using Integrated Passive Device Technology on Glass Substrate," Microwave Symposium Digest (MTT), 2010 IEEE MTT-S International, May 2010, IEEE, Piscataway, NJ, pp. 1372-1375.

Fu, Jia-Shiang et al., "A Ferroelectric-Based Impedance Tuner for Adaptive Matching Applications," Microwave Symposium Digest, 2008 IEEE MTT-S International, Jun. 2008, IEEE, Piscataway, NJ, pp. 955-958.

Mikhemar, Mohyee et al., "An On-Chip Wideband and Low-Loss Duplexer for 3G/4G CMOS Radios," IEEE Symposium on VLSI Circuits 2010, Jun. 2010, IEEE, Piscataway, NJ, pp. 129-130.

Mikhemar, M. et al., "A Tunable Integrated Duplexer with 50dB Isolation in 40nm CMOS," IEEE International Solid State Circuits Conference, Feb. 2009, IEEE, Piscataway, NJ, pp. 386-387, 387a.

Mobley, Tim et al., "Through Glass Via (TGV) Solutions for Wafer and Chip Level Interposers and RF Integration Methods for High Frequency Applications," Mar. 2012, nMode Solutions, Tucson, Arizona, 25 pages.

Orlandi, S. et al., "Optimization of shielded PCB air-core toroids for high efficiency dc-dc converters," Energy Conversion Congress and Exposition, Sep. 2009, IEEE, Piscataway, NJ, pp. 2073-2080.

Shorey, Aric et al., "Development of Substrates Featuring Through Glass Vias (TGV) for 3D-IC Integration," Corning Incorporated, 2010, Corning, New York, pp. 1-3.

Töpper, Michael et al., "3-D Film Interposer Based on TGV (Through Glass Vias): An Alternative to Si-Interposer," 2010 Electronic Components and Technology Conference, Jun. 2010, IEEE, Piscataway, NJ, pp. 66-73.

Yoon, Yeong J. et al., "Design and Characterization of Multilayer Spiral Transmission-Line Baluns," IEEE Transactions on Microwave Theory and Techniques, Sep. 1999, vol. 47, No. 9, IEEE, Piscataway, NJ, pp. 1841-1847.

Yu, Xuehong et al., "Silicon-Embedding Approaches to 3-D Toroidal Inductor Fabrication," Journal of Microelectromechanical Systems, Jun. 2013, vol. 22, No. 3, IEEE, Piscataway, NJ, pp. 580-588.

* cited by examiner

FREQUENCY MULTIPLEXER

I. CROSS-REFERENCE TO RELATED APPLICATION(S)

The present application claims priority from U.S. Provisional Patent Application No. 61/981,538, entitled "FREQUENCY MULTIPLEXER," filed Apr. 18, 2014, the contents of which are incorporated by reference in their entirety.

II. FIELD

The present disclosure is generally related to frequency multiplexers.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may support carrier aggregation to receive communications via multiple distinct frequency bands via a single antenna of the wireless telephone. For example, a wireless telephone may include a frequency diplexer that is configured to separate a high-band component of an input signal from a low-band component of the input signal for separate processing of the components. Frequency diplexers may be used to concurrently extract three or more carrier signals from an aggregation of the carrier signals, such as by using a serial arrangement of the frequency diplexers (which may result in degraded performance due to insertion loss), or by using additional antennas (which may result in increased device size and/or cost).

IV. SUMMARY

A frequency multiplexer circuit is configured to concurrently extract three or more carrier signals from an aggregated carrier circuit. High-quality factor circuit components may enable fine resolution between adjacent frequency bands while maintaining a relatively small device size, such as by using a passive-on-glass (POG)-type fabrication technology. Switching circuitry may be used to combine one or more extracted signals, enabling reconfiguration of the frequency multiplexer circuit to enable operation according to various wireless communication protocols by a wireless communication device.

In a particular embodiment, an apparatus includes a frequency multiplexer circuit coupled to an input node and configured to receive an input signal via the input node. The frequency multiplexer circuit includes a first filter circuit configured to attenuate first frequency components of the input signal that are outside of a first frequency range. The frequency multiplexer circuit includes a second filter circuit configured to attenuate second frequency components of the input signal that are outside of a second frequency range. The frequency multiplexer circuit also includes a third filter circuit configured to attenuate third frequency components of the input signal that are outside of a third frequency range. In response to the input signal corresponding to a carrier aggregation signal that comprises a first carrier signal having a first frequency within the first frequency range, a second carrier signal having a second frequency within the second frequency range, and a third carrier signal having a third frequency within the third frequency range, the frequency multiplexer circuit is configured to provide the first carrier signal at a first output of the first filter circuit, the second carrier signal at a second output of the second filter circuit, and the third carrier signal at a third output of the third filter circuit.

In another particular embodiment, the apparatus includes a frequency multiplexer circuit coupled to an input node and configured to receive an input signal via the input node. The frequency multiplexer circuit includes a first filter circuit configured to attenuate first frequency components of the input signal that are outside of a first frequency range. The frequency multiplexer circuit includes a second filter circuit configured to attenuate second frequency components of the input signal that are outside of a second frequency range. The frequency multiplexer circuit also includes a third filter circuit configured to attenuate third frequency components of the input signal that are outside of a third frequency range. The apparatus also includes a switching circuit that is configurable to couple at least two of a first output of the first filter circuit, a second output of the second filter circuit, or a third output of the third filter circuit to a single output port.

In another particular embodiment, the apparatus includes a frequency multiplexer circuit coupled to an input node and configured to receive an input signal via the input node. The frequency multiplexer circuit includes a first filter circuit configured to attenuate first frequency components of the input signal that are outside of a first frequency range. The frequency multiplexer circuit includes a second filter circuit configured to attenuate second frequency components of the input signal that are outside of a second frequency range. The frequency multiplexer circuit also includes a third filter circuit configured to attenuate third frequency components of the input signal that are outside of a third frequency range. In a particular exemplary implementation, the frequency multiplexer circuit is integrated in a device having an area of less than approximately 8 square millimeters and having a height of less than approximately 0.5 millimeters.

In another particular embodiment, a method includes receiving, at a frequency multiplexer circuit, an input signal via an input node. The input signal corresponds to a carrier aggregation signal that includes a first carrier signal corresponding to a first frequency range, a second carrier signal corresponding to a second frequency range, and a third carrier signal corresponding to a third frequency range. The method includes providing the input signal to a first filter circuit configured to attenuate first frequency components of the input signal that are outside of the first frequency range, to a second filter circuit configured to attenuate second frequency components of the input signal that are outside of the second frequency range, and to a third filter circuit configured to attenuate third frequency components of the input signal that are outside of the third frequency range. The method also includes providing to a single output port at least two of the first carrier signal at a first output of the first filter circuit, the second carrier signal at a second output of the second filter circuit, or the third carrier signal at a third output of the third filter circuit.

In another particular embodiment, an apparatus includes first means for filtering an input signal to attenuate first frequency components of the input signal that are outside of a first frequency range. The apparatus includes second means for filtering the input signal to attenuate second frequency components of the input signal that are outside of a second frequency range. The apparatus also includes third means for filtering the input signal to attenuate third frequency components of the input signal that are outside of a third frequency range. The apparatus also includes means for coupling at least two of a first output of the first means for filtering, a second output of the second means for filtering, or a third output of the third means for filtering to a single output port.

In a particular embodiment, a computer readable medium stores instructions executable by a computer. The instructions include instructions that are executable by the computer to cause a frequency multiplexer circuit to receive an input signal via an input node (e.g., a processor may send a control signal to activate a switching network at an input of the frequency multiplexer circuit, such as the switching network 702 coupled to the frequency multiplexer circuit 128 as described with respect to FIG. 7). The input signal corresponds to a carrier aggregation signal that includes a first carrier signal corresponding to a first frequency range, a second carrier signal corresponding to a second frequency range, and a third carrier signal corresponding to a third frequency range. The instructions are executable by the computer to cause the input signal to be provided to a first filter circuit configured to attenuate first frequency components of the input signal that are outside of the first frequency range, to a second filter circuit configured to attenuate second frequency components of the input signal that are outside of the second frequency range, and to a third filter circuit configured to attenuate third frequency components of the input signal that are outside of the third frequency range (e.g., a processor may send one or more control signals to configure connections of a switching network to inputs of filter circuits of the frequency multiplexer circuit, such as the switching network 702 coupled to the frequency multiplexer circuit 128 as described with respect to FIG. 7). The instructions are executable to provide to a single output port at least two of the first carrier signal that is provided at a first output of the first filter circuit, the second carrier signal that is provided at a second output of the second filter circuit, and the third carrier signal that is provided at a third output of the third filter circuit (e.g., a processor may send a control signal to configure a switching circuit at an output of the frequency multiplexer circuit, such as the switching circuit 220 coupled to the frequency multiplexer circuit 128 as described with respect to FIG. 2, to couple multiple outputs of the frequency multiplexer circuit to a single output port).

One particular advantage provided by at least one of the disclosed embodiments is that multiple carrier signals may be extracted from a carrier aggregated signal with relatively low insertion loss, reduced device size, and/or using a fewer number of antennas as compared to devices that include multiple serially-connected frequency diplexers for carrier extraction. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
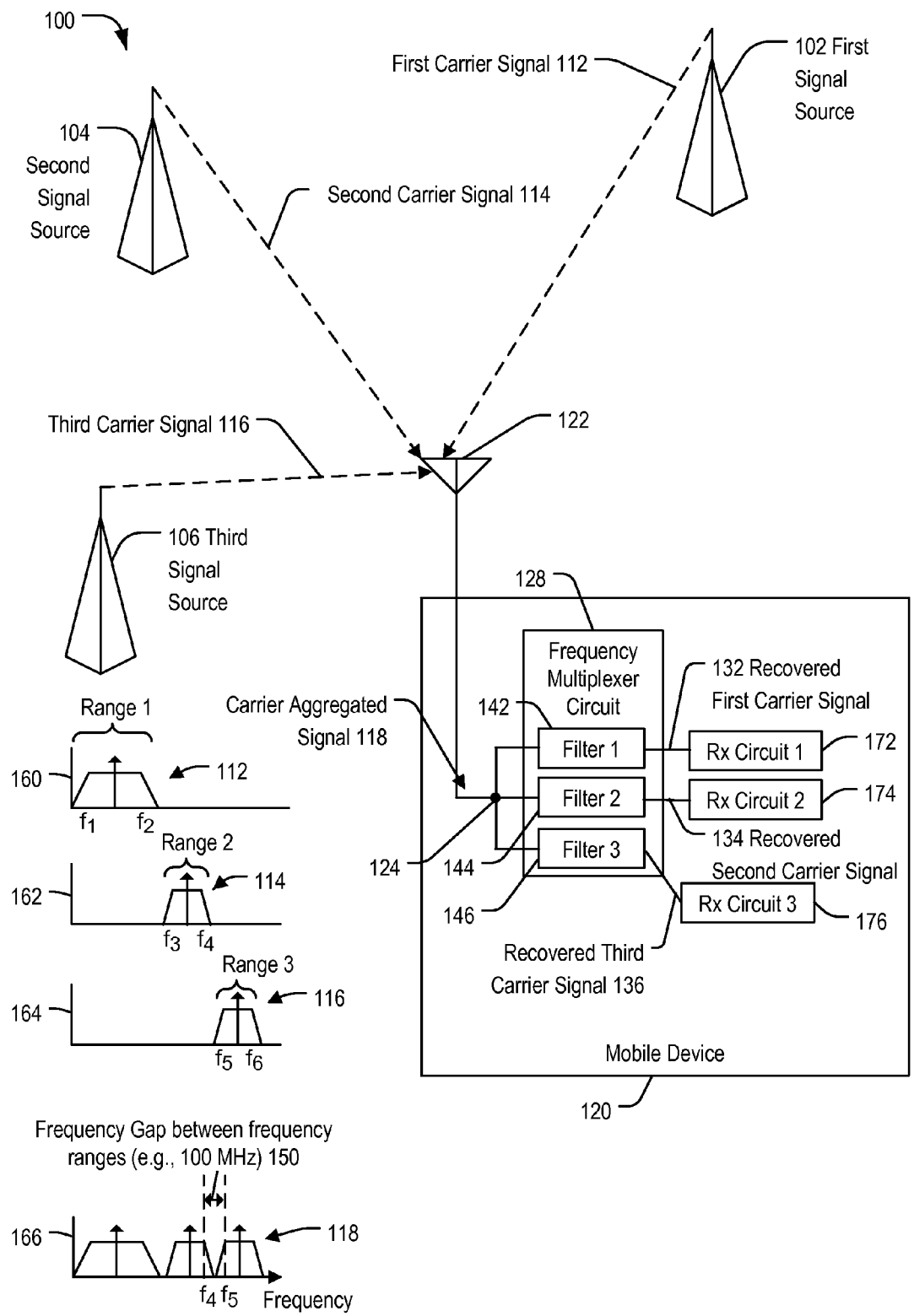
FIG. 1 is a general diagram of a particular illustrative embodiment of a system that includes a device having a frequency multiplexer circuit configured to enable concurrent extraction of three or more carrier signals from a received carrier aggregated signal.

Referring to FIG. 1, a particular embodiment of a system that includes a mobile device 120 having a frequency multiplexer circuit 128 is depicted and generally designated 100. The system 100 includes a first signal source 102, a second signal source 104, and a third signal source 106. The mobile device 120 is in communication with each of the signal sources 102-106. The mobile device 120 includes the frequency multiplexer circuit 128. The frequency multiplexer circuit 128 enables a carrier aggregated signal 118 received by an antenna 122 of the mobile device 120 to be used to generate multiple recovered carrier signals.

The first signal source 102 may include a first transmitter, such as the transmitter of a first wireless network. For example, the first signal source 102 may be a transmitter of a Code Division Multiple Access (CDMA) system, a Broadcast System for Mobile Communications (GSM) system, a Wideband CDMA (WCDMA) system, a Long Term Evolution (LTE) system, an LTE Advanced system, or another type of wireless communication system. The mobile device 120 may receive a first carrier signal 112 generated by the first signal source 102. Similarly, the second signal source 104 may include a second transmitter. The mobile device 120 may receive a second carrier signal 114 generated by the second signal source 104. The third signal source 106 may include a third transmitter. The mobile device 120 may receive a third carrier signal 116 generated by the third signal source 106. The signal sources 102-106 may correspond to a common wireless communication system (e.g., multiple transmitters in a LTE system) or may correspond to distinct communication systems. Although three distinct sources 102-106 are illustrated, in other embodiments two or three of the carrier signals 112-116 may be transmitted via a single transmitter.

A first frequency graph 160 of the first carrier signal 112 illustrates components of the first carrier signal 112 within a first frequency range that extends between a first frequency (F1) (e.g., 0 hertz (Hz)) and a second frequency F2. The first carrier signal 112 includes a first carrier frequency (indicated by a vertical arrow) within the first frequency range, and the first frequency range may include a bandwidth that is allocated for modulation of the first carrier signal 112. Thus, the first carrier signal 112 "corresponds to" the first frequency range. A second frequency graph 162 illustrates components of the second carrier signal 114 showing signal components within a second frequency range between a third frequency F3 and a fourth frequency F4, where the second carrier signal 114 corresponds to the second frequency range. A third frequency graph 164 illustrates the third carrier signal 116 having non-zero components in a third frequency range between a fifth frequency F5 and a sixth frequency F6, where the third carrier signal 116 corresponds to the third frequency range. When received at the antenna 122, the carrier signals 112-116 may be aggregated at a common input node 124, as illustrated in a fourth frequency graph 166. The fourth frequency graph 166 illustrates a frequency gap 150 between adjacent frequency ranges for the second carrier signal 114 and the third carrier signal 116. For example, the frequency difference between the frequencies F4 and F5 may be less than 200 megahertz (MHz), such as a 100 MHz gap 150.

The frequency multiplexer circuit 128 of the mobile device 120 includes a first filter circuit 142, a second filter circuit 144, and a third filter circuit 146. The first filter circuit 142 is configured to attenuate the first frequency components of the input signal that is received via the input node 124, such as the carrier aggregated signal 118, that are outside of the first frequency range. For example, the first filter circuit 142 may correspond to a filter for the first carrier signal 112 and may attenuate frequency components that are below the first frequency F1 and may also attenuate frequency components that are above the second frequency F2. The second filter circuit 144 is configured to attenuate the second frequency components of the input signal that are outside of a second frequency range. For example, when the second filter circuit 144 corresponds to a filter for the second carrier signal 114, the second filter circuit 144 is configured to attenuate the frequency components that are below the third frequency F3 and to also attenuate frequency components that are above the fourth frequency F4. The third filter circuit 146 is configured to attenuate third frequency components of the input signal that are outside of a third frequency range. For example, when the third filter circuit 146 corresponds to the third carrier signal 116, the third filter circuit 146 may be configured to attenuate signal components having frequencies below the fifth frequency F5 and may also attenuate signal components having frequencies higher than the sixth frequency F6.

An output of the first filter circuit 142 may be provided to a first receiver circuit 172. For example, the first filter circuit 142 may generate a recovered first carrier signal 132 by blocking signal components outside of the first frequency range between F1 and F2. The first receiver circuit 172 may include one or more radiofrequency or baseband components, such as a mixing circuit, one or more amplifiers, a modulator/demodulator (modem), one or more other circuits, or a combination thereof. An output of the second filter circuit 144 is provided to a second receiver circuit 174. For example, the second filter circuit 144 may generate a recovered second carrier signal 134 by attenuating components of the input signal that have a frequency less than F3 or that have a frequency higher than F4. The third filter circuit 146 may provide an output to a third receiver circuit 176 that corresponds to a filtered output of the input signal, such as a recovered third carrier signal 136. For example, the third filter circuit 146 may generate a recovered third carrier signal 136 by attenuating components of the input signal that have a frequency less than F5 or that have a frequency higher than F6.

During operation, the mobile device 120 may receive, via the antenna 122, multiple signals that have different frequency ranges, such as the first carrier signal 112, the second carrier signal 114, and the third carrier signal 116. The received signals may be aggregated as the carrier aggregated signal 118 and provided via the input node 124 to the frequency multiplexer circuit 128. Each of the filter circuits 142-146 may operate in parallel on respective portions of the frequency range of the input signal to generate individual signals corresponding to the received carriers 112-116 corresponding to the recovered carrier signals 132-136. Each of the recovered carrier signals 132-136 may be provided to a separate RF chain, such as illustrated as the first receiver circuitry 172, the second receiver circuitry 174, and the third receiver circuitry 176.

By having multiple filter circuits within the frequency multiplexer circuit 128, individual carrier signals of the carrier aggregated signal 118 may be extracted and provided for further processing. In addition, by using high quality factor (high-Q) circuit components, such as high-Q capacitors and inductors having relatively low resistance or other losses, extraction of distinct carrier signals that are separated by small frequency gaps between the frequency ranges, such as the frequency gap 150, may be achievable within a commercially viable device size. For example, by using one or more circuit components at the frequency multiplexer circuit 128, such as inductors, according to a passive-on-glass (POG)-type fabrication technology, as illustrated further with respect to FIGS. 8-10, a high-Q filter component may be provided having a reduced footprint as compared to components fabricated according to conventional fabrication techniques. For example, the frequency multiplexer circuit 128 using high-Q filter components may be integrated into a device having an area of less than approximately 8 square millimeters and having a height of less than approximately 0.5 millimeters, as described in further detail with respect to FIG. 5.

Figure 2:
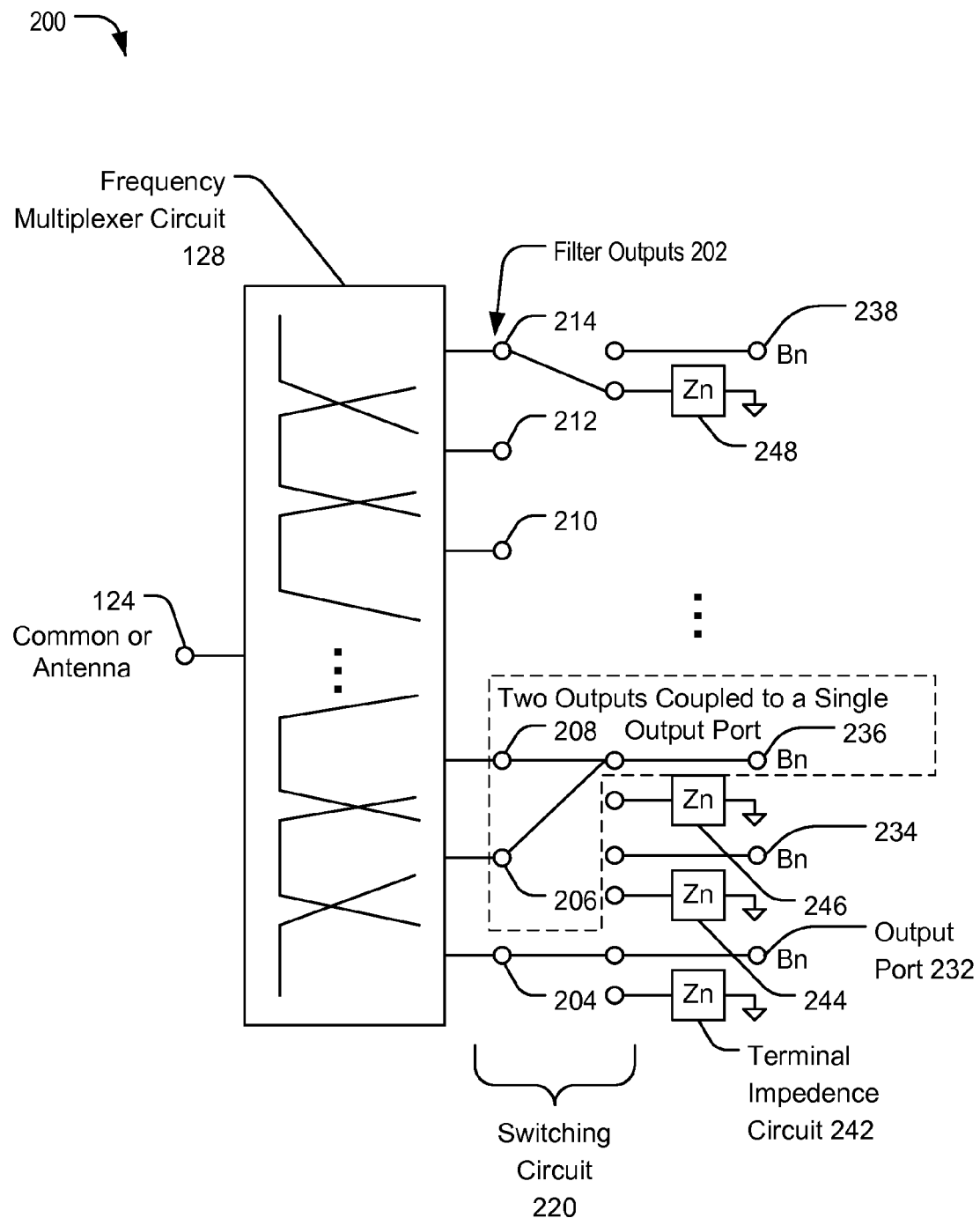
FIG. 2 is a general diagram of a particular illustrative embodiment of the frequency multiplexer circuit of FIG. 1.

Although the frequency multiplexer circuit 128 is illustrated as including three filter circuits 142-146, in other embodiments, the frequency multiplexer circuit 128 may include more than three filter circuits, such as described with respect to FIG. 2. In addition, although the frequency multiplexer circuit 128 is shown as having outputs of each filter circuit 142-148 directed toward a respective receiver processing chain 172-176, in other embodiments filter circuit outputs of the frequency multiplexer circuit 128 may be switched among one or more distinct output ports and/or terminal impedance circuits, such as described in further detail with respect to FIGS. 2 and 3. Further, although the frequency multiplexer circuit 128 is described as having each of the filter circuits 142-146 coupled to the input node 124, in other embodiments the individual filters of the frequency multiplexer circuit 128 may be selectively coupled or decoupled to the input node 124 via a switching network, such as described further with respect to FIG. 7.

By providing frequency demultiplexing of the carrier aggregated signal 118, the frequency multiplexer circuit 128 enables the mobile device 120 to process multiple input signals concurrently or substantially concurrently. For example, the mobile device 120 may be configured to comply with carrier selection criteria corresponding to a long term evolution (LTE) communication standard that specifies specific frequency ranges for multiple carriers and further specifies a relatively small frequency gap, such as a 100 megahertz frequency gap, between two of the frequency ranges, such as illustrated in the fourth frequency diagram 166. For example, a first frequency range for a first carrier may include frequencies between 0 MHz and 960 MHz, a second frequency range for a second carrier may include frequencies between 1.4 GHz and 2.2 GHz, and a third frequency rage for a third carrier may include frequencies between 2.3 GHz and 2.7 GHz. The frequency gap between the second frequency range and the third frequency range is 100 MHz.

Referring to FIG. 2, an exemplary embodiment of an implementation of the frequency multiplexer circuit 128 of FIG. 1 is depicted and generally designated 200. The input node 124 of FIG. 1 may be coupled to a common input signal or an antenna, such as the antenna 122 of FIG. 1. The frequency multiplexer circuit 128 includes multiple filter outputs 202, such as a first filter output 204, a second filter output 206, a third filter output 208, a fourth filter output 210, a fifth filter output 212, and a sixth filter output 214. Although six filter outputs 204-214 are illustrated as corresponding to six distinct filter circuits within the frequency multiplexer circuit 128, in other embodiments the frequency multiplexer circuit 128 may have more than six filter outputs corresponding to more than six filter circuits or may have less than six filter outputs corresponding to less than six filter circuits.

Switching circuitry 220 is configured to couple one or more of the filter outputs 202 to one or more output ports, such as a first output port 232, a second output port 234, a third output port 236, or a fourth output port 238. For example, the switching circuitry 220 is illustrated in a configuration that couples the first filter output 204 to the first output port 232. The switching circuitry 220 is also illustrated as being configured to couple at least two of the filter outputs 202 to a single output port. For example, the switching circuitry 220 is configured to couple at least two of the first output 204, the second output 206, and the third output 208 to a single output port, such as the third output port 236. The embodiment illustrated in FIG. 2 depicts an example of two outputs coupled to a single output port in which the second filter output 206 and the third filter output 208 are both coupled to the third output port 236. One or more other groups of outputs of the frequency multiplexer circuit 128 may be coupled to other output ports. To illustrate, two or more of the outputs 210, 212, or 214 may be coupled to the single output port 238 instead of, or in addition to, the outputs 206, 208 being coupled to the single output port 236, as an illustrative, non-limiting example. The switching circuitry 220 is further configured to couple at least one of the filter outputs 202 to a terminal impedance circuit, such as a first terminal impedance circuit 242, a second terminal impedance circuit 244, a third terminal impedance circuit 246, or a fourth terminal impedance circuit 248. As illustrated, the switching circuitry 220 couples the sixth filter output 214 to the fourth terminal impedance circuit 248.

The switching circuitry 220 enables outputs of multiple filter circuits to be aggregated into a single frequency output signal, such as by combining a signal at the second filter output 206 and a signal at the third filter output 208 to form an output signal at the third output port 236. The output signal at the third output port 236 may have a bandwidth substantially equal to a sum of a bandwidth corresponding to a pass band of a filter circuit coupled to the second output 206 and a pass band of a filter circuit coupled to the third output 208 of the frequency multiplexer 128. Alternatively, the switching circuitry 220 may couple a single filter output to a single output port, such as the first filter output 204 illustrated as coupled to the first output port 232. Thus, the switching circuitry 220 enables a selection and arrangement of frequency bands to be provided at various output ports 232-238 to accommodate various wireless communication configurations.

The terminal impedance circuits 242-248 may include one or more circuit components configured to provide a terminal impedance to unused filter outputs. For example, each filter output of the filter outputs 202 that is not coupled via the switching circuitry 220 to an output port 232-238 may be coupled to a terminal impedance circuit 242-248. Coupling "unused" filter outputs 202 to terminal impedance circuits 242-248 may reduce noise, insertion loss, or one or more other losses that may occur within the frequency multiplexer circuit 128.

Figure 5:
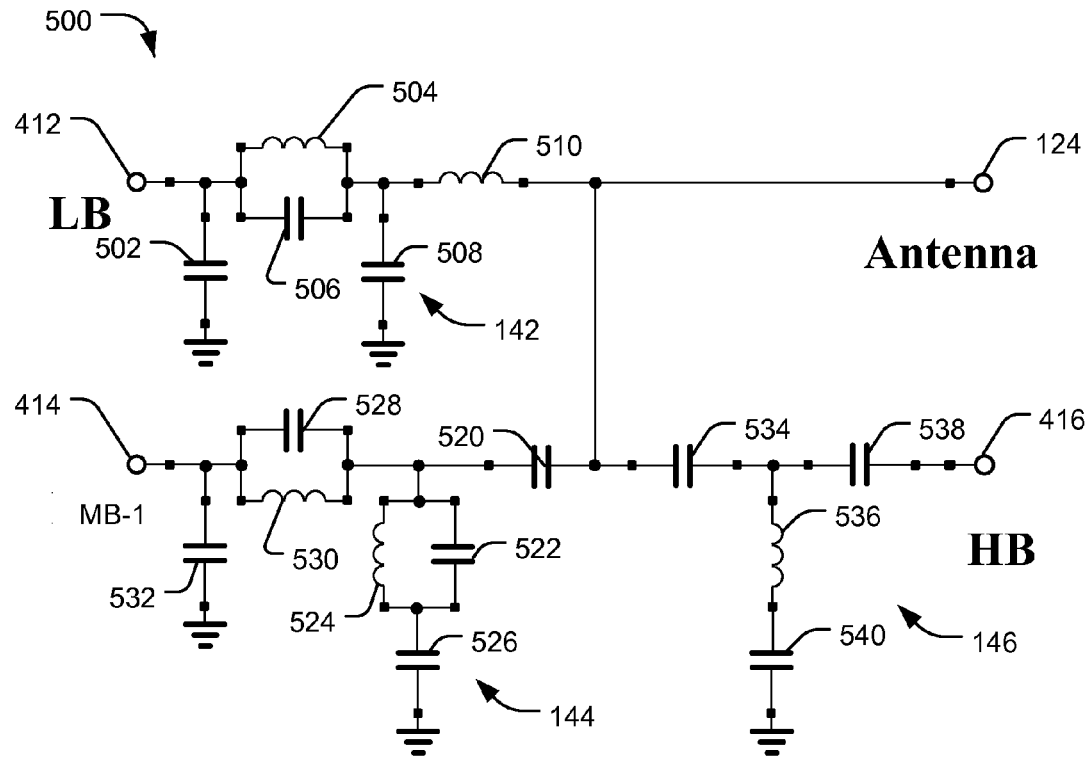
FIG. 5 is a circuit diagram of a particular illustrative embodiment of the frequency multiplexer circuit of FIG. 1 having three filter circuits.
Figure 5:
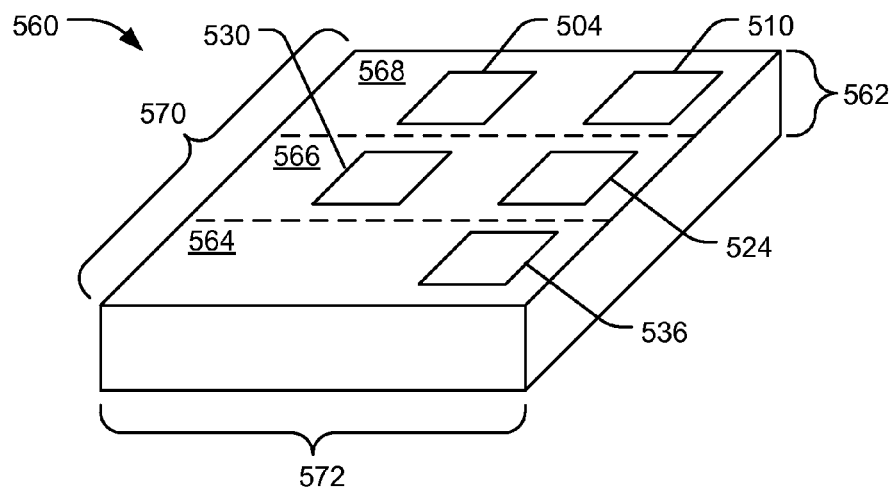

Circuit components of one or more filter circuits associated with the frequency multiplexer circuit 128 may be adjustable such as described further with respect to FIG. 5. Further, one or more components of the terminal impedance circuits 242-248 may be adjustable. For example, one or more of the terminal impedance circuits 242 may include one or more of an inductive element, a capacitive element, a resistive element, or any combination thereof. One or more of the inductive, capacitive, or resistive elements may be adjustable, such as by selection of a size, length, or other property of a circuit component via a control signal. To illustrate, a control signal may be provided via a processor of the mobile device 120 of FIG. 1, such as a baseband processor or modem. An example of a processor generating control signals to control operation of a frequency multiplexer circuit is depicted in further detail with respect to FIG. 11.

Figure 3:
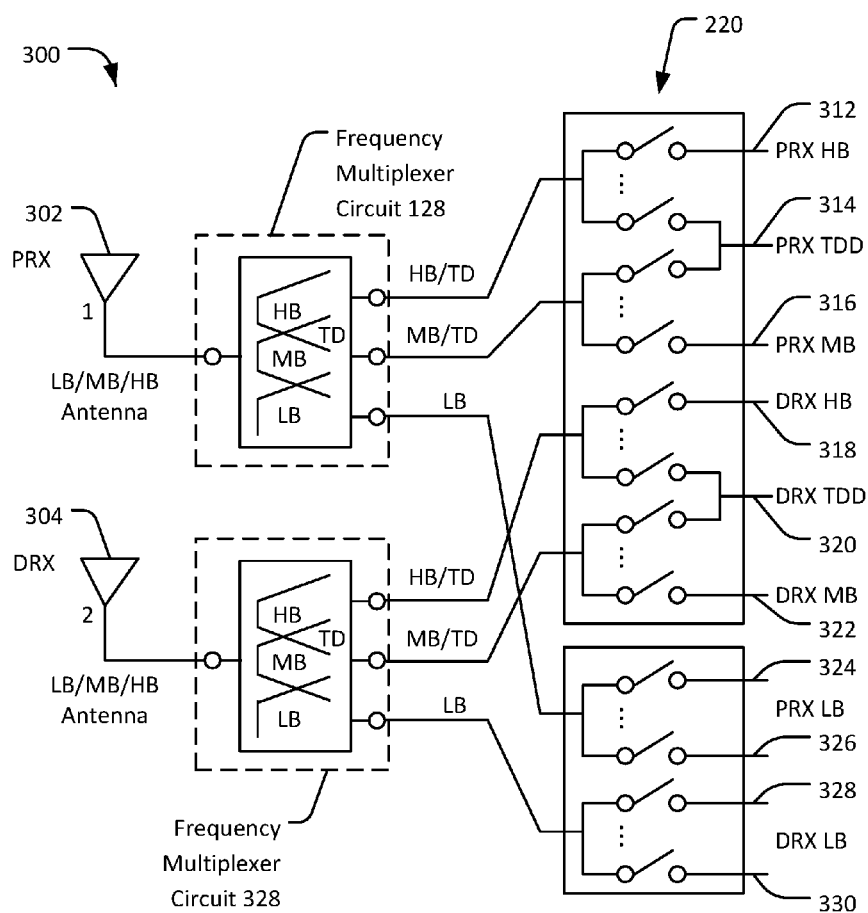
FIG. 3 is a general diagram of another illustrative embodiment of the frequency multiplexer circuit of FIG. 2.

Referring to FIG. 3, a particular embodiment of a system that includes the frequency multiplexer circuit 128 of FIG. 1 is depicted and generally designated 300. The system 300 includes a diversity antenna array including a primary antenna 302 and a diversity antenna 304. The primary antenna 302 is coupled to the frequency multiplexer circuit 128. The diversity antenna 304 is coupled to a second frequency multiplexer circuit 328 that may be configured in a similar manner as described with reference to the frequency multiplexer 128 of FIG. 1. The system 300 further includes the switching circuitry 220 of FIG. 2

The first frequency multiplexer circuit 128 and the second frequency multiplexer circuit 328 may be reconfigurable and may each include three filter circuits that are designated as corresponding to a low-band (LB), a middle-band (MB), and a high-band (HB), respectively. Each of the filter circuit outputs may be coupled to the switching circuitry 220. The switching circuitry 220 is configurable to generate, in a first mode, primary high-band, primary middle-band, and primary low-band signals and to also generate diversity high-band, diversity middle-band, and diversity low-band signals at output ports 312, 316, 324, 318, 322, and 328, respectively. In a second mode of operation, the switching circuitry 220 is configured to combine signals at the high-band filter output and the middle-band filter output of the first frequency multiplexer 128 to generate a primary time division duplexed (TDD) signal at the output port 314. In the second mode of operation, the switching circuitry 220 is also configured to combine signals at the high-band filter output and the middle-band filter output of the second frequency multiplexer 328 to generate a diversity TDD signal at the output port 320. Also in the second mode of operation, the primary low-band signal is provided at the output port 324 and the diversity low-band signal is provided at the output port 328.

By switching between modes of operation, the system 300 enables a high-band, middle-band, and low-band output, for the primary antenna 302 and for the diversity antenna 304, to be received in the first mode of operation, and in the second mode of operation to receive TDD signals via the primary antenna 302 and the diversity antenna 304, while also receiving low-band signals from both of the antennas 302-304. An example of the switching circuitry 220 depicted in FIG. 3 and a frequency graph of the output signals in the first mode of operation and in the second mode of operations are illustrated in further detail with respect to FIG. 4.

Figure 4:
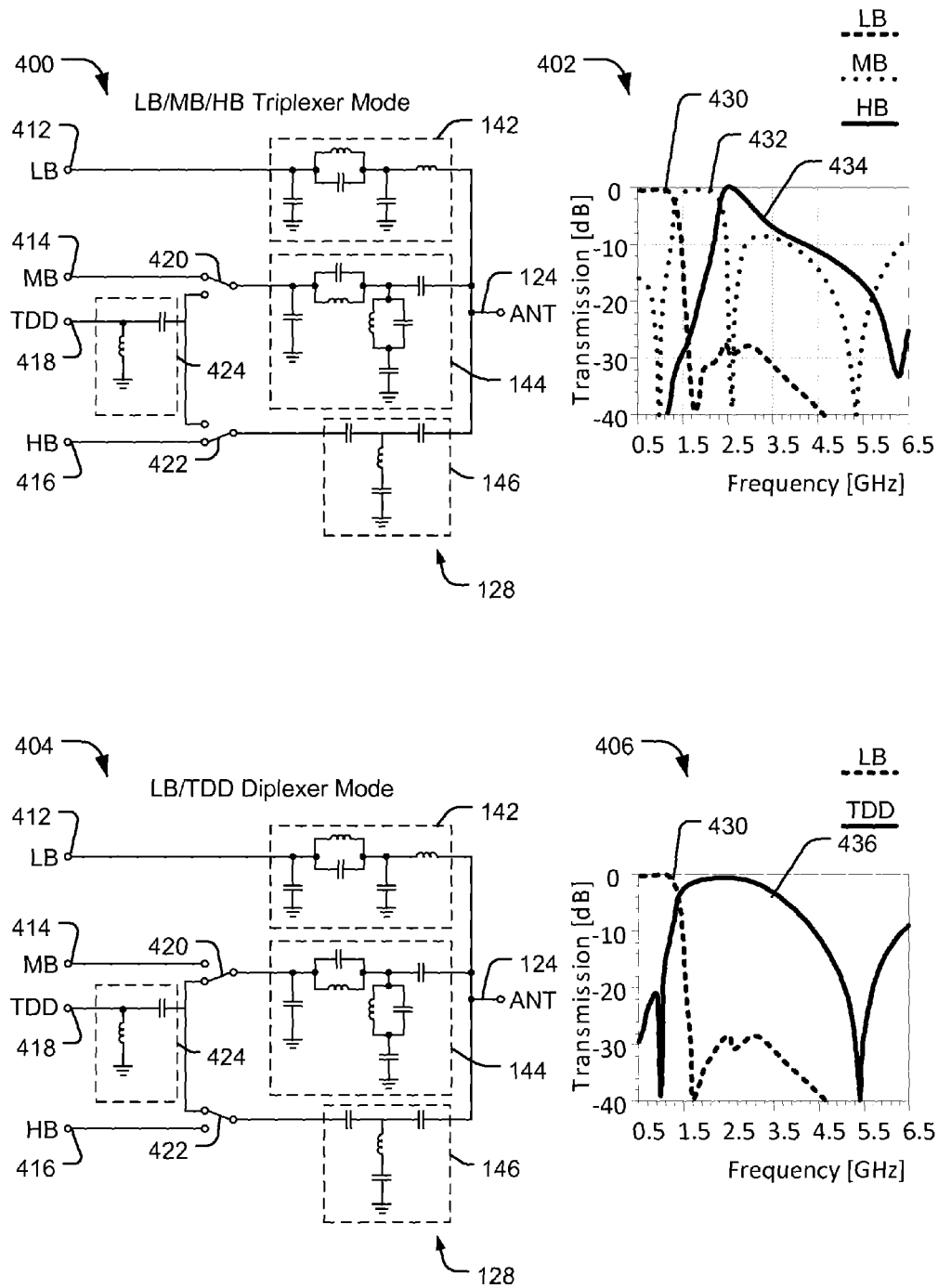
FIG. 4 is a general diagram of another illustrative embodiment of the frequency multiplexer circuit of FIG. 2.

Referring to FIG. 4, a first configuration 400 illustrates circuit components of the frequency multiplexer circuit 128 of FIG. 1 in a low-band/middle-band/high-band triplexer mode and a corresponding frequency graph 402 showing signal components. FIG. 4 also depicts a second configuration 404 of the frequency multiplexer circuit 128 of FIG. 3 in the second mode of operation, illustrated as a low-band/TDD diplexer mode. A frequency graph 406 illustrates signal frequency components according to the second mode of operation.

In the first mode of operation according to the first configuration 400, the switching circuitry 220 of FIG. 3 includes a first switch 420 and a second switch 422. The common node 124 is coupled to the first filter circuit 142 having a first filter output that is coupled to a low-band output port 412. The common node 124 is further coupled to the second filter circuit 144 having a second filter output that is coupled to the first switch 420. The first switch 420 may be selectively coupled to a middle-band port 414 or to an input of a matching circuit 424 that is coupled to a TDD output port 418. The common node 124 is further coupled to the third filter circuit 146, and a third filter output of the third filter circuit 146 is coupled to the second switch 422. The second switch 422 is configured to be coupled to an input of the matching circuit 424 or to a high-band output port 416. In the first mode of operation illustrated by the first configuration 400, the first switch 420 couples the output of the second filter circuit 144 to the middle-band output port 414 and the second switch 422 couples the output of the third filter circuit 146 to the high-band output port 416.

The frequency graph 402 illustrates a transmission signal strength in decibels as a function of frequency, as illustrative, non-limiting examples. A first curve 430 corresponds to a signal at the low-band output port 412. A second curve 432 corresponds to a signal at the middle-band output port 414. A third curve 434 illustrates a signal at the high-band output port 416.

The second configuration 404 illustrates that the first switch 420 couples the second filter circuit 144 to the matching circuit 424 rather than to the middle-band output port 414. The third filter circuit 146 is coupled to the matching circuit 424 via the second switch 422 rather than to the high-band output port 416. Thus, output signals from the second filter circuit 144 and the third filter circuit 146 are combined at an input of the matching circuit 424. The matching circuit 424 is configured to provide a frequency shift to tune a frequency peak of a resulting output signal at the TDD output port 418. To illustrate, the frequency chart 406 depicts the first curve 430 corresponding to the output at the low-band output port 412. In addition, a TDD output signal 436 is illustrated corresponding to an output at the TDD output port 418 as an illustrative, non-limiting example. As illustrated, the TDD curve 436 has a bandwidth approximately equal to the sum of the bandwidths of the middle-band and high-band signals illustrated in the frequency graph 402, with a signal peak shifted to approximately 2.3 gigahertz by the matching circuit 424. In addition, the TDD curve also covers the frequency gap between the middle-band and high-band signals, so as to support the frequency bands (e.g., frequency gap 150) that are not supported in the LB/MB/HB triplexer mode.

Referring to FIG. 5, a particular embodiment of circuitry corresponding to the frequency multiplexer circuit 128 is depicted and generally designated 500. The first filter circuit 142 is coupled to the common node 124 and to the low-band output port 412 and includes a capacitor 502 coupled to the low-band output port 412. A first inductor 504 is coupled in parallel to a capacitor 506 at the low-band output port 412. The first inductor 504 and the capacitor 506 are further coupled to a capacitor 508 and to a first terminal of a second inductor 510. A second terminal of the second inductor 510 is coupled to the common node 124.

The second filter circuit 144 includes a third capacitor 520 coupled to the input node 124. A first inductor/capacitor (LC) circuit includes a third inductor 524 coupled in parallel with a capacitor 522, and a second LC circuit includes a fourth inductor 530 coupled in parallel with a capacitor 528. An output of the first LC circuit is coupled to ground via a capacitor 526. An output of the second LC circuit is coupled to the middle-band output node 414 and is coupled to ground via a capacitor 532.

The third filter circuit 146 is illustrated as including a capacitor 534 having a first capacitor terminal coupled to the common node 124. A second terminal of the capacitor 534 is coupled to a first terminal of a capacitor 538. A second terminal of the capacitor 538 is coupled to the high-band output node 416. The second terminal of the capacitor 534 is also coupled to a first terminal of a fifth inductor 536. A second terminal of the fifth inductor 536 is coupled to ground via a capacitor 540.

In a particular embodiment, each of the capacitors and inductors of the frequency multiplexer circuit have particular characteristics. For example, within the first filter circuit 142, the capacitor 502 may have a capacitance of 0.8 picofarads (pF), the first inductor 504 may have an inductance of 5.2 nanohenrys (nH), and the capacitor 508 may have a capacitance of 1.4 pF. The particular characteristics of the capacitors and inductors of the first filter circuit 142 may enable the first filter circuit 142 to pass signal components that fall within a first frequency range between 0 MHz and 960 MHz. Within the second filter circuit 144, the capacitor 520 may have a capacitance of 1.8 pF, the third inductor 524 may have an inductance of 4.6 nH, the capacitor 522 may have a capacitance of 1 pF, the fourth inductor 530 may have an inductance of 1 nH, the capacitor 528 may have a capacitance of 3.8 pF, the capacitor 526 may have a capacitance of 6.6 pF, and the capacitor 532 may have a capacitance of 0.35 pF. The particular characteristics of the capacitors and inductors of the second filter circuit 144 may enable the second filter circuit 144 to pass signal components that fall within a second frequency range between 1.4 GHz to 2.2 GHz. Within the third filter circuit 146, the capacitor 534 may have a capacitance of 0.35 pF, the capacitor 538 may have a capacitance of 0.35 pF, the fifth inductor 536 may have an inductance of 6 nH, and the capacitor 540 may have a capacitance of 12 pF. The particular characteristics of the capacitors and inductors of the third filter circuit 146 may enable the third filter circuit 146 to pass signal components that fall within a third frequency range between 2.3 GHz to 2.7 GHz. The first frequency range may correspond to a low band (LB), the second frequency range may correspond to a mid band (MB), and the third frequency range may correspond to a high band (HB).

Although not illustrated in FIG. 5, one or more of the components (e.g., one or more inductors and/or one or more capacitors) may be adjustable. For example, one or more components of the frequency multiplexer circuit 128 may represent a bank of selectable components that may be switched into or out of the circuit responsive to one or more control signals, such as control signals received from a baseband processor or modem to adjust performance or parameter settings of the frequency multiplexer circuit 128.

As shown in FIG. 5, the frequency multiplexer circuit 128 may be integrated in a device 560. For example, the device 560 may include a first portion 564, a second portion 566, and a third portions 568. The first portion 564 may include the fifth inductor 536, the second portion 566 may include the third inductor 524 and the fourth inductor 530, and the third portion 568 may include the first inductor 504 and the second inductor 510. The device 560 may a length 570, a width 572, and a height 562.

An area of the device 560 may be determined by multiplying the length 570 by the width 572. In a particular embodiment, an area of the device 560 is less than approximately 8 square millimeters and the device has a height of less than approximately 0.5 millimeters. For example, an area of each of the portions 564-568 may be approximately 2.5 square millimeters, and the device 564 may have an area of approximately 3×2.5=7.5 square millimeters. Manufacture of high-Q inductors and capacitors in a device having the indicated dimensions may be achieved using passive-on-glass fabrication technologies, such as described with respect to FIGS. 8-11.

The particular embodiment of FIG. 5 is illustrated for exemplary purposes. Even though FIG. 5 shows a configurations of three filter circuits, other embodiments may include, more than or fewer than three filter circuits. Further, alternative configurations of filter circuits may be used.

Figure 6:
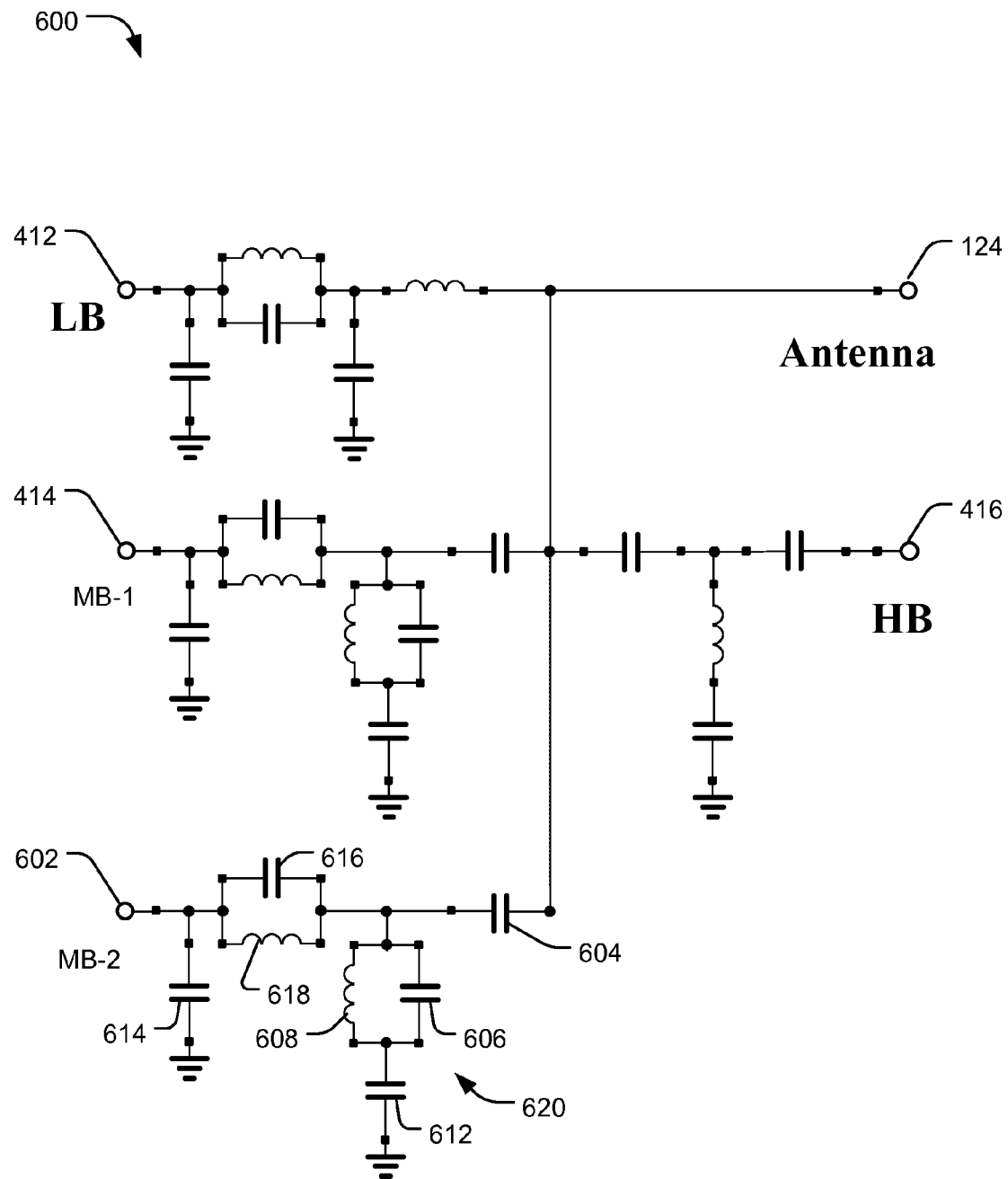
FIG. 6 is a circuit diagram of another particular illustrative embodiment of the frequency multiplexer circuit of FIG. 1 having four filter circuits.

Referring to FIG. 6, an illustrative embodiment of the frequency multiplexer circuit 128 of FIG. 1 is depicted and generally designated 600. The common node 124 is coupled to the low-band output port 412 via the first filter circuit 142 as illustrated in FIG. 5, the input node 124 is coupled to the middle-band output port 414 via the second filter circuit 144 as illustrated in FIG. 5, and the high-band output port 416 is coupled to the input node 124 via the third filter circuit 146 as illustrated in FIG. 5. A second middle-band output port 602 is coupled to the input node 124 via a fourth filter circuit 620.

As illustrated, the fourth filter circuit 620 includes a capacitor 604 having a first terminal coupled to the input node 124 and having a second terminal coupled to a first LC circuit and to a second LC circuit. The first LC circuit includes a capacitor 606 coupled in parallel to an inductor 608. The first LC circuit is coupled to ground via a capacitor 612. The second LC circuit includes a capacitor 616 coupled in parallel to an inductor 618. The second LC circuit is coupled to the second middle-band output port 602. In addition, the second middle-band output port 602 is coupled to ground via a capacitor 614. As illustrated in FIG. 6, the first filter circuit 142 corresponds to a low-band filter and the third filter circuit 146 corresponds to a high-band filter. The first middle-band filter circuit 144 corresponds to a first band pass filter, and the second middle-band filter circuit 620 corresponds to a second band pass filter. By selecting and/or adjusting values of capacitors and/or inductors within one or more of the filter circuits 142, 144, 146, and/or 620, a frequency response may be adjusted to correspond to received input signals. Although the embodiment depicted in FIG. 6 illustrates two middle-band filter circuits 144 and 620, in other embodiments additional filter circuits may be added and may have a circuit structure substantially similar to the second filter circuit 144 and/or the filter circuit 620, with values of capacitances and inductances that correspond to a frequency range for the additional filter(s).

Figure 7:
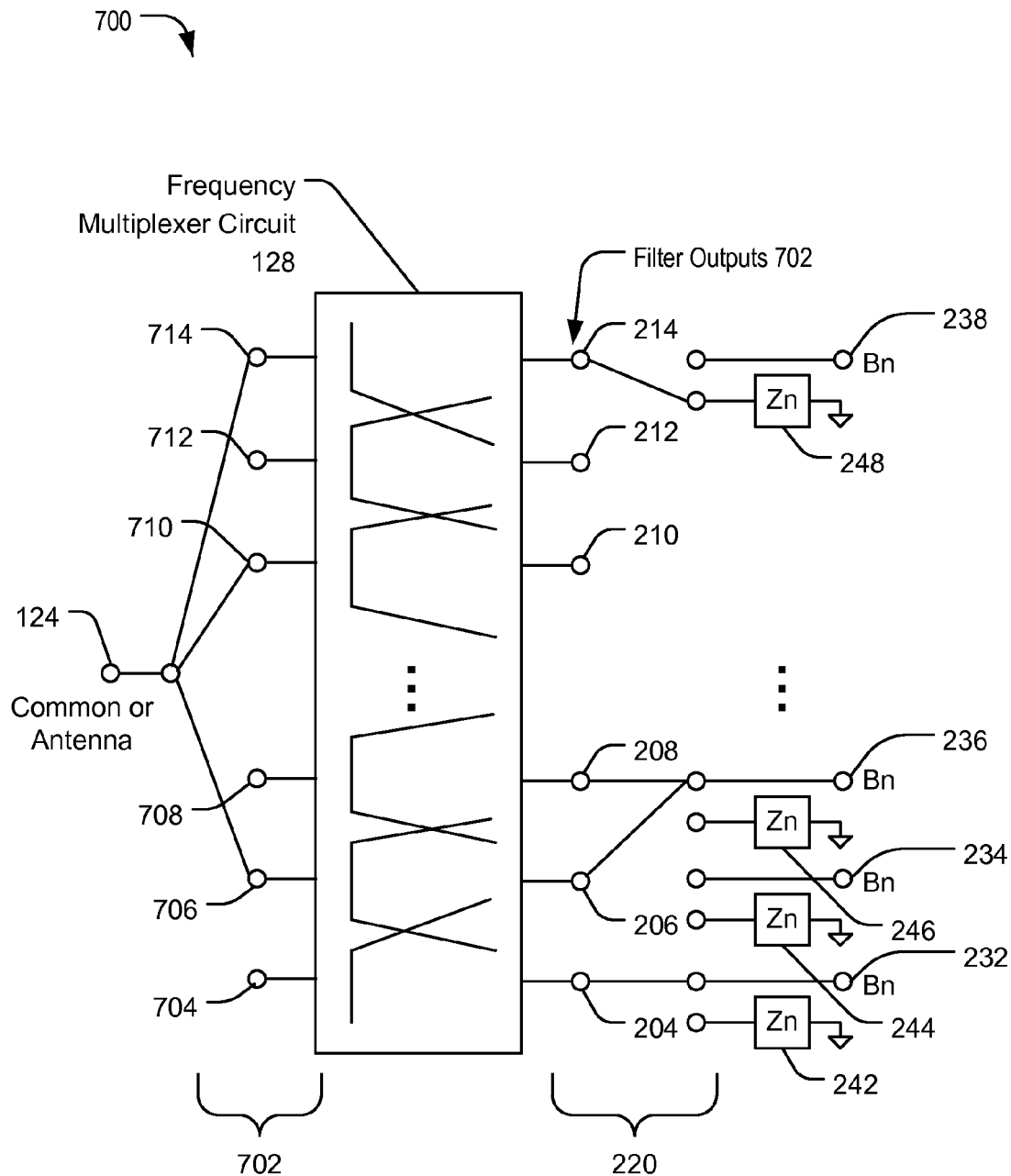
FIG. 7 is a general diagram of a particular illustrative embodiment of the frequency multiplexer circuit of FIG. 1 including an input switching network.

Referring to FIG. 7, a particular embodiment of a device that includes an implementation of the frequency multiplexer circuit 128 of FIG. 1 is depicted and generally designated 700. The input node 124 is coupled to the frequency multiplexer circuit 128 via a switching network 702. The frequency multiplexer circuit 128 includes the multiple filter outputs 204-214 that are coupled to one or more of the output ports 232-238 or to the terminal impedance components 242-248 via the switching circuitry 220 of FIG. 2.

The switching network 702 is configured to selectively couple the input node 124 to one or more filter inputs 704, 706, 708, 710, 712, or 714. For example, as illustrated in FIG. 7, the input node 124 is coupled via the switching network 702 to a second filter input 706, a fourth filter input 710, and a sixth filter input 714, and the input node 124 is not connected to a first filter input 704, a third filter input 708, or a fifth filter input 712. By selectively coupling the input node 124 to filter circuits and not coupling (i.e., not inserting into the signal path) filter circuits that are not used for recovering carrier signals from a carrier aggregated signal at the common node 124, an insertion loss and/or other performance decreasing effects may be reduced and/or eliminated during operation of the frequency multiplexer circuit 128.

Figure 8:
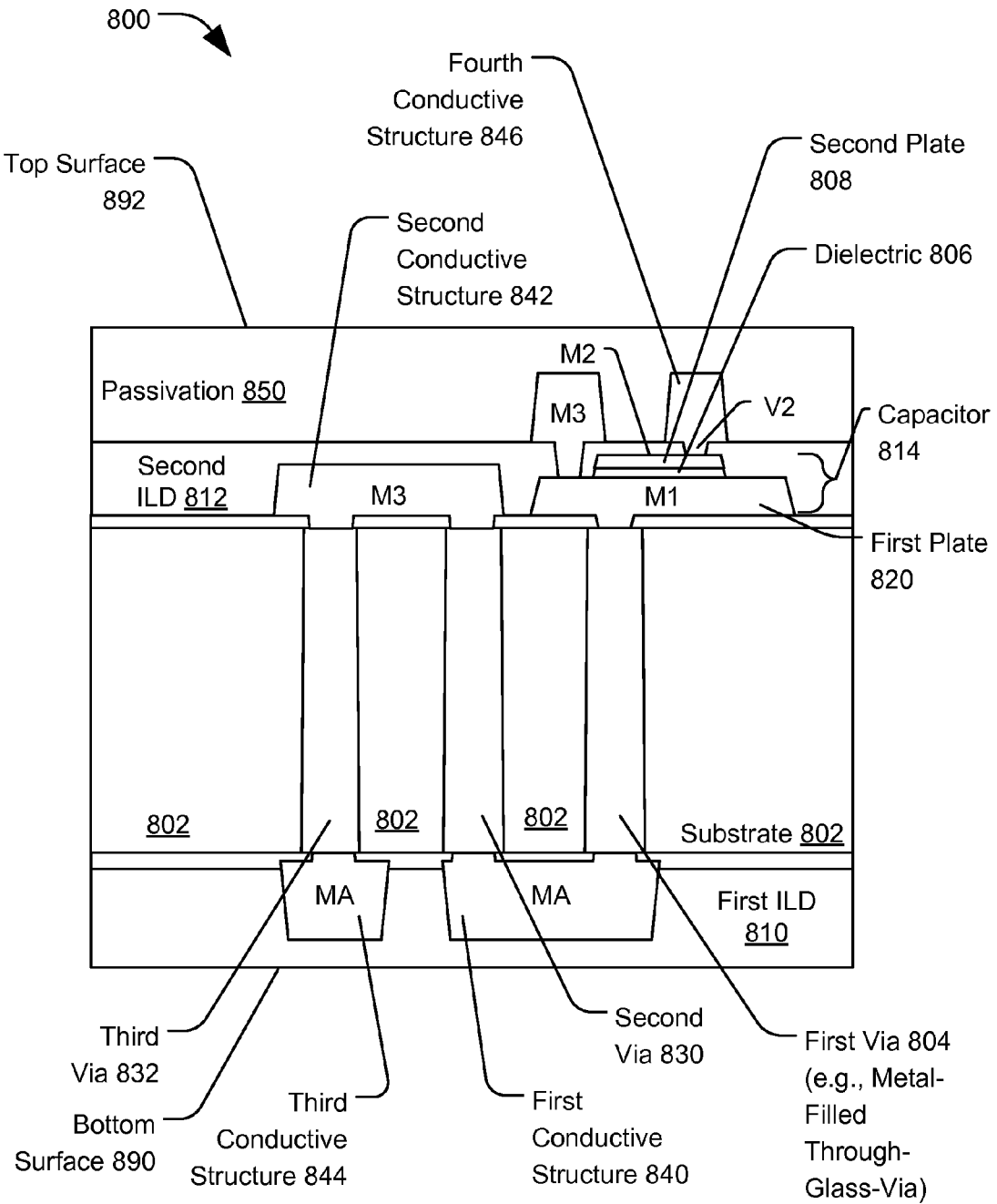
FIG. 8 is a diagram of an illustrative embodiment of circuit components that may be used in connection with the frequency multiplexer circuit of FIG. 1.

Referring to FIG. 8, a cross sectional view of a particular illustrative embodiment of a device 800 is disclosed. The device 800 may include a capacitor and an inductor that may correspond to any combination of capacitor and inductor that share a node within the first filter circuit 142, the second filter circuit 144, and/or the third filter circuit 146 of FIG. 1. For example, the device 800 may correspond to any of the capacitors and inductors that share a node as described with reference to FIG. 4-FIG. 6. To illustrate, referring to FIG. 5, the device 800 may correspond to one of the capacitors 502, 506, 508 and the inductor 504. As another example, the device 800 may correspond to one of the capacitors 506, 508, 520, 534 and the inductor 510. As another example, the device 800 may correspond to one of the capacitors 520, 528, 532 and the inductor 530. As another example, the device 800 may correspond to one of the capacitors 520, 522, 526, 528 and the inductor 524. As another example, the device 800 may correspond or to one of the capacitors 534, 538, 540 and the inductor 536. To further illustrate, referring to FIG. 6, the device 800 may correspond to one of the capacitors 604, 606, 612, 616 and the inductor 608, or to one of the capacitors 604, 606, 616, 620 and the inductor 618.

The device 800 includes a bottom surface 890 and a top surface 892. The device 800 further includes a substrate 802. The device 800 may include a first via 804 that extends through the substrate 802 from one side of the substrate 802 to the other side of the substrate 802. The device 800 also includes a capacitor 814. The capacitor 814 includes a dielectric 806 between the first via 804 and a second plate 808 of the capacitor 814.

The substrate 802 may be made of a low-loss material (e.g., dielectric, wide-bandgap semiconductor, etc.). The low-loss material may include a dielectric material or a highly-insulative semiconductor material. In a particular embodiment, the device 800 is a passive device, the substrate 802 includes a glass-type substrate, and the first via 804 includes a through-glass via (TGV). The substrate 802 may include a glass substrate, a quartz substrate, a silicon-on-insulator (SOI) substrate, a silicon-on-sapphire (SOS) substrate, a high resitivity substrate (HTRS), a gallium arsenide (GaAs) substrate, an indium phosphide (InP) substrate, a silicon carbide (SiC) substrate, an aluminum nitride (AlN) substrate, rogers laminates, or a plastic substrate, as illustrative, non-limiting examples.

The first via 804 may be filled with metal. In a particular embodiment, the metal includes at least one of copper (Cu), tungsten (W), silver (Ag), or gold (Au).

In a particular embodiment, the capacitor 814 includes a second plate 808 (e.g., a second metal layer), the dielectric 806, and a first plate 820 (e.g., a first metal layer). The first plate 820 may be located between the first via 804 and the dielectric 806. The first plate 820 is electrically coupled to the first via 804. The first plate 820 and the second plate 808 are located within the device 800. The dielectric 806 may include at least one of silicon dioxide (SiO2), silicon nitride (Si3N4), silicon oxynitride (SiOxNy), tantalum pentoxide (Ta2O5), aluminum oxide (Al2O3), or aluminum nitride (AlN). The second plate 808 of the capacitor 814 is external to (e.g., above and not embedded within) the substrate 802.

The device 800 may include an inductor that includes the first via 804, a first conductive structure 840 (e.g., a back-side metal layer), a second via 830, a second conductive structure 842 (e.g., a third metal layer), a third via 832, and a third conductive structure 844 (e.g., a back-side metal layer).

The first conductive structure 840 and the third conductive structure 844 may be located in a first inter-layer dielectric (ILD) 810 to electrically insulate the first conductive structure 840 and the third conductive structure 844 from other devices or circuitry. The capacitor 814 and the second conductive structure 842 may be located in a second ILD 812 to electrically insulate the capacitor 814 and the second conductive structure 842 from other devices or circuitry. The second plate 808 may be located between a fourth conductive structure 846 (e.g., a third metal layer) and the dielectric 806. In a particular embodiment, the fourth conductive structure 846 may be located in a passivation layer 850 to electrically insulate the fourth conductive structure 846 from other devices or circuitry.

The inductor and the capacitor 814 may form a resonant circuit. For example, when the capacitor 814 is charged with a first polarity and begins to discharge, an electric current may begin flowing through the inductor. While the capacitor 814 discharges, a magnetic field of the inductor may build as a result of the electric current flowing through the inductor. After the capacitor 814 has discharged, the magnetic field may cause the capacitor 814 to charge with an opposite polarity to the first polarity as flow of the electric current through the inductor is reduced. A second electric current in an opposite direction of the electric current may then begin flowing through the inductor as a strength of the magnetic field is reduced. The second electric current may discharge the capacitor 814 and then recharge the capacitor 814 with the earlier polarity. Voltage across the capacitor 814 and the inductor may oscillate at a frequency (e.g., a resonant frequency) approximately equal to a capacitance value of the capacitor 814 multiplied by an inductance value of the inductor. Losses in current due to resistance may dampen oscillations and may reduce efficiency of the circuit.

By having a capacitor 814 with a dielectric 806 between the first via 804 and the second plate 808 of the capacitor 814, a resistance between the first via 804 and the capacitor 814 may be reduced. The first circuit of the device 800 may have lower power consumption than by having a capacitor 814 that is not positioned above the first via 804. For example, the first circuit may have a lower resistance by use of the capacitor 814 without added resistance from a metal line connecting the first via 804 to the capacitor 814. The reduced resistance may result in lower power consumption during use of the first circuit. Further, the quality factor (Q factor) of the first circuit may be higher than conventional circuits. The higher quality factor indicates a lower rate of energy loss relative to stored energy of the first circuit. In addition, the first circuit may have a smaller size by including the capacitor 814 above, rather than beside (or offset from), the first via 804.

It is noted that in the particular embodiments of the present disclosure, film deposition processes, such as chemical vapor deposition (CVD), physical vapor deposition (PVD) (e.g., sputtering or evaporation), and/or electroplating may be used to form metal layers and inter-metal dielectric layers. Photolithography may be used to form patterns of metal layers. An etching process may be performed to remove unwanted materials. Planarization processes such as "etch-back" and chemical-mechanical polishing (CMP) may be employed to create a flat surface.

It is also noted that only a limited number of connectors, inductors, layers, and other structures or devices are shown in the figures of this disclosure for ease of illustration and clarity. Those of ordinary skill in the art will appreciate that, in practice, the device 800 may host a number of connectors, inductors, layers, and other structures or devices.

Figure 9:
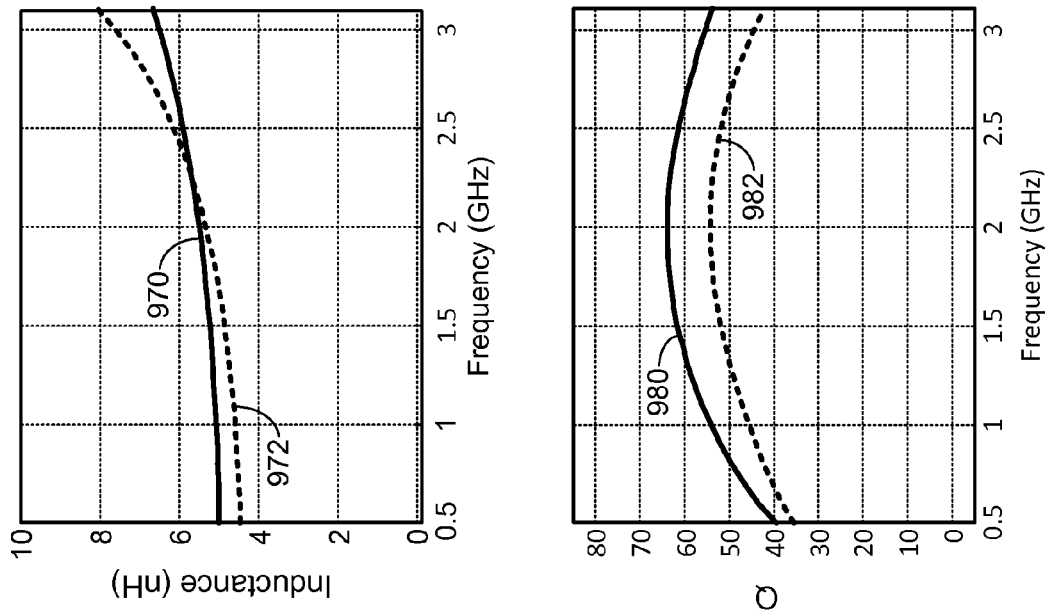
FIG. 9 is a diagram of another illustrative embodiment of circuit components that may be used in connection with the frequency multiplexer circuit of FIG. 1.
Figure 9:
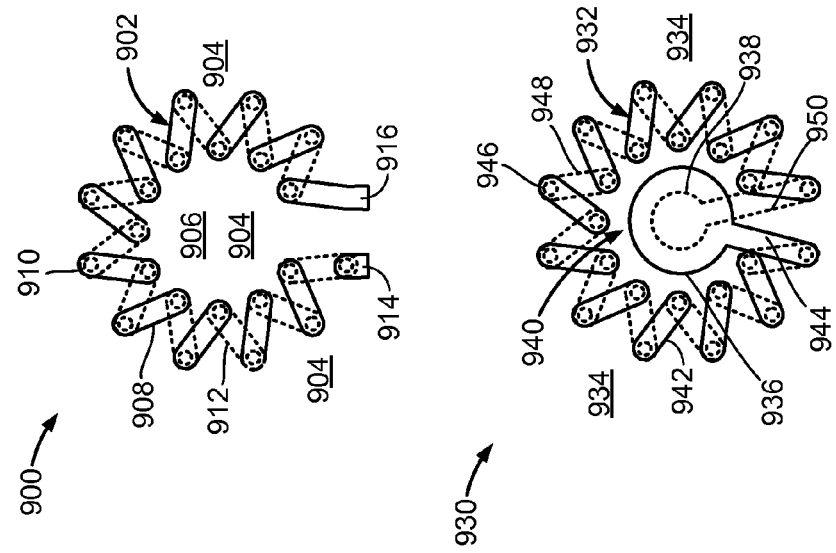

FIG. 9 depicts simulation results of inductance versus frequency and simulation results of quality factor (Q) versus frequency for a first device 900 and a second device 930. The first device 900 or the second device 930 may correspond to any of the inductors described with reference to the first filter circuit 142, the second filter circuit 144, and/or the third filter circuit 146 of FIG. 1. For example, the first device 900 or the second device 930 may correspond any of the inductors as described with reference to FIG. 4-FIG. 6. To illustrate, the first device 900 may correspond to one or more of the inductors 504, 510, 524, 528, 556 of FIG. 5 and/or to one or more of the inductors 608, 618 of FIG. 6.

The first device includes a toroidal inductor 902 integrated with a substrate 904 with connectors for the toroidal inductor 902 located outside of a central region 906 of the toroidal inductor 902. The second device 930 includes a toroidal inductor 932 integrated with a substrate 934 with connectors 936, 938 for the toroidal inductor 932 located inside of a central region 940 of the toroidal inductor 932. The first device 900 and the second device 930 may be formed in accordance with techniques as described in FIG. 8. For the top view representation of the first device 900 depicted in FIG. 9, solid lines indicate leads 908 on a top surface of the substrate 904, dashed circles indicate conductive vias 910 beneath the leads 908, and dashed lines indicate leads 912 on a bottom surface of the substrate 904. Connectors for the toroidal inductor 902 are located outside of the central region 906 defined by the toroidal inductor 902. The connectors for the toroidal inductor 902 are coupled to leads 914, 916.

For the top view representation of the second device 930 depicted in FIG. 9, solid lines indicate leads 942, 944 and the first connector 936 on a top surface of the substrate 934, dashed circles indicate conductive vias 946 beneath the leads 942, and dashed lines indicate leads 948, 950 and the second connector 938 on a bottom surface of the substrate 934. Connectors 936, 938 are surrounded by the conductive vias 946 that form the toroidal inductor 932.

Curve 970 depicts simulation results of inductance versus frequency for the first device 900, and curve 972 depicts simulation results of inductance versus frequency for the second device 930. Curve 980 depicts simulation results of quality factor versus frequency for the first device 900, and curve 982 depicts simulation results of quality factor versus frequency for the second device 930. Table 1 depicts values from the simulation results at a frequency of 1 GHz. The curves 970, 972, 980, 982 and the values from Table 1 show that a device formed with a toroidal inductor integrated in a substrate such that connectors for the toroidal inductor are surrounded by conductive vias of the toroidal inductor (e.g., the second device 930 of FIG. 9) has comparable performance to a similar device with a toroidal inductor integrated in a substrate where the connectors of the toroidal inductor are not surrounded by conductive vias of the toroidal inductor (e.g., the first device 900 of FIG. 9). However, an area of the second device 930 may be less than an area of the first device 900. Thus, the second device 930 may have a smaller chip size than the first device 900 and exhibit a similar inductance without sacrificing a quality factor (Q) value.

TABLE 1

|  | Device 900 | Device 930 |
|---|---|---|
| L (nH) | 5.1 | 4.6 |
| Q | 54 | 46 |

Figure 10:
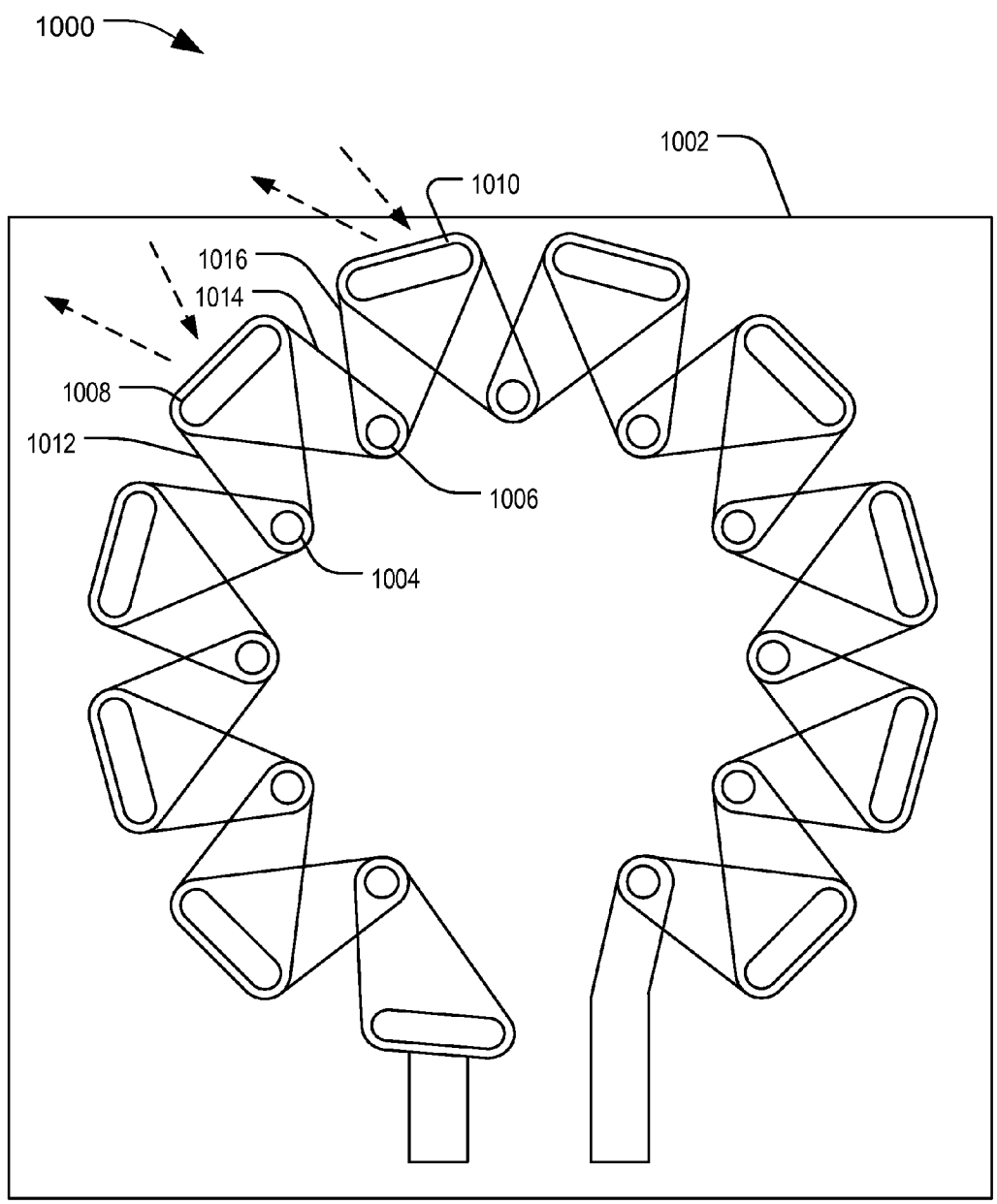
FIG. 10 is a diagram of an illustrative embodiment of an inductor that may be used in connection with the frequency multiplexer circuit of FIG. 1.

FIG. 10 is a diagram illustrating a particular embodiment of a device 1000 that includes a through glass via (TGV) having a non-circular cross section to increase a quality factor (Q factor) by reducing loses due to stray magnetic fields. The electronic device 1000 is a toroidal inductor and may correspond to the first device 900 or the second device 930 of FIG. 9. For example, the device 1000 may correspond to any of the inductors described with reference to the first filter circuit 142, the second filter circuit 144, and/or the third filter circuit 146 of FIG. 1. To illustrate, the device 1000 may correspond to one or more of the inductors 504, 510, 524, 528, 556 of FIG. 5 and/or one or more of the inductors 608, 618 of FIG. 6.

The electronic device 1000 may include a glass substrate 1002, a first set of TGVs, a second set of TGVs, and metal traces that connect the first set of TGVs to the second set of TGVs. The electronic device 1000 may further include asymmetrical TGVs. For example, the first set of TGVs may include a first TGV 1004 and a second TGV 1006. The first set of TGVs may correspond to an inner region of the electronic device 1000. While only two of the TGVs in the inner region of the toroidal inductor are described, the inner region includes many TGVs (see FIG. 10). The second set of TGVs may include a third TGV 1008 and a fourth TGV 1010. The second set of TGVs may correspond to an outer region of the electronic device 1000. While only two of the TGVs in the outer region of the toroidal inductor are described, the outer region includes many TGVs (see FIG. 10). The first TGV 1004 may be connected to the third TGV 1008 via a first metal trace 1012. The third TGV 1008 may be connected to the second TGV 1006 via a second metal trace 1014. The second TGV 1006 may be connected to the fourth TGV 1010 via a third metal trace 1016. The first metal trace 1012 and the third metal trace 1016 may be located on the top surface of the glass substrate 1002. The second metal trace 1014 may be located on the bottom surface of the glass substrate 1002.

The first TGV 1004 and the second TGV 1006 may each have a circular cross sectional shape. The third TGV 1008 and the fourth TGV 1010 may each have a non-circular cross-sectional shape. During operation, current may flow from one TGV to another TGV via a metal trace (e.g., current may flow from the first TGV 1004 to the third TGV 1008 via the first metal trace 1012). The non-circular cross sections of the third TGV 1008 and the fourth TGV 1010 enable the third TGV 1008 and the fourth TGV 1010 to have a greater width than the first TGV 1004 and the second TGV 1006. The third TGV 1008 and the fourth TGV 1010 may provide shielding from surrounding magnetic fields (as indicated by dotted arrows in FIG. 10). Such shielding of magnetic fields results in greater efficiency and a reduced resistance of the electronic device 1000. A Q factor indicates inductor efficiency in storing energy. In a particular embodiment, the electronic device 1000 has a quality (Q) factor of 66.3 at 2 GHz as compared to a Q factor of 62.4 of a toroidal inductor implemented using TGVs that have circular cross-sectional shapes. Thus, the electronic device 1000 that includes TGVs with a non-circular cross section has an increased inductor efficiency.

Although the toroidal inductor 1000 is illustrated in FIG. 10, it should be understood that other structures may include TGVs having non-circular cross sections (e.g., the third TGV 1008 and the fourth TGV 1010). For example, a half bent solenoid inductor may include TGVs having non-circular cross sections on an outer region of the half bent solenoid inductor and may include TGVs having circular cross sections on an inner region of the half bent solenoid inductor. As another example, an S-shaped inductor may include TGVs having non-circular cross sections on an outer region (e.g., a bent region) of the S-shaped inductor and may include TGVs having circular cross sections on an inner region (e.g., a straight region) of the S-shaped inductor.

Figure 11:
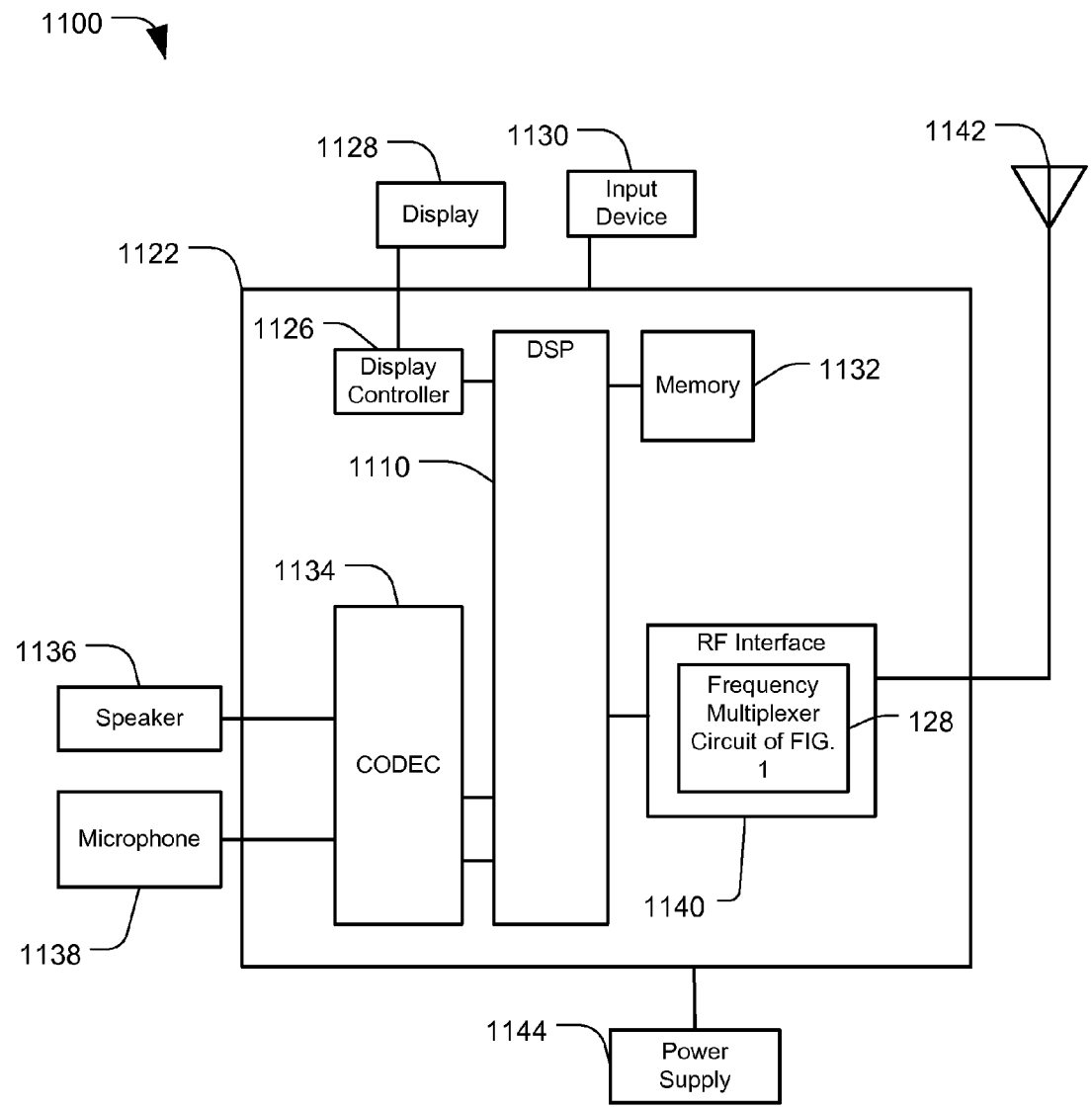
FIG. 11 is a block diagram of an electronic device including the frequency multiplexer device of FIG. 1.

Referring to FIG. 11, a block diagram of a particular illustrative embodiment of a wireless communication device is depicted and generally designated 1100. The device 1100 includes a processor, such as a digital signal processor (DSP) 1110, coupled to a memory 1132. The device 1100 further includes a radio frequency (RF) interface 1140. The 1140 may include the frequency multiplexer circuit 128 of FIG. 1.

The frequency multiplexer circuit 128 may include the first filter circuit 142, the second filter circuit 144, and/or the third filter circuit 146 of FIG. 1. Further, the frequency multiplexer circuit 128 may be accessible to the digital signal processor 1110 to perform operations as described with reference to FIG. 1-FIG. 7. For example the digital signal processor 1110 may be coupled to the memory 1132. The memory 1132 may be a non-transitory computer readable memory storing instructions executable by the digital signal processor 1110. The instructions may include instructions to cause a frequency multiplexer circuit to receive an input signal via an input node. The input signal may correspond to a carrier aggregation signal that includes a first carrier signal corresponding to a first frequency range, a second carrier signal corresponding to a second frequency range, and a third carrier signal corresponding to a third frequency range. The instructions may further include instructions to cause the input signal to be provided to a first filter circuit configured to attenuate first frequency components of the input signal that are outside of the first frequency range, to a second filter circuit configured to attenuate second frequency components of the input signal that are outside of the second frequency range, and to a third filter circuit configured to attenuate third frequency components of the input signal that are outside of the third frequency range. The first carrier signal may be provided at a first output of the first filter circuit, the second carrier signal is provided at a second output of the second filter circuit, and the third carrier signal is provided at a third output of the third filter circuit. For example, the digital signal processor 1110 may generate control signals that control operation of the switching circuits 220 of FIG. 2, the switching network 702 of FIG. 7, adjustment of adjustable components (e.g., variable inductors and/or capacitors described with respect to the circuit 500 of FIG. 5), or any combination thereof.

FIG. 11 also shows a display controller 1126 that is coupled to the digital signal processor 1110 and to a display 1128. A coder/decoder (CODEC) 1134 can also be coupled to the digital signal processor 1110. A speaker 1136 and a microphone 1138 can be coupled to the CODEC 1134.

FIG. 11 also shows that the radio frequency interface 1140 may be coupled to a wireless antenna 742. In a particular embodiment, the DSP 1110, the display controller 1126, the memory 1132, the CODEC 1134, and the radio frequency interface 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display 1128, the input device 1130, the speaker 1136, the microphone 1138, the wireless antenna 1142, and the power supply 1144 are external to the system-on-chip device 1122. However, each of the display 1128, the input device 1130, the speaker 1136, the microphone 1138, the wireless antenna 1142, and the power supply 1144 can be coupled to a component of the system-on-chip device 1122, such as an interface or a controller.

In conjunction with the described embodiments, an apparatus is disclosed that may include first means for filtering an input signal to attenuate first frequency components of the input signal that are outside of a first frequency band, such as the first filter circuit 142 of FIGS. 1, 4, 5, and/or 6, one or more other devices or circuits configured to filter an input signal to attenuate first frequency components of the input signal that are outside of a first frequency band, or any combination thereof. The apparatus may also include second means for filtering the input signal to attenuate second frequency components of the input signal that are outside of a second frequency band, such as the second filter circuit 144 of FIGS. 1, 4, 5, and/or 6, one or more other devices or circuits configured to filter the input signal to attenuate second frequency components of the input signal that are outside of a second frequency band, or any combination thereof. The apparatus may also include third means for filtering the input signal to attenuate third frequency components of the input signal that are outside of a third frequency band, such as the third filter circuit 146 of FIGS. 1, 4, 5, and/or 6, one or more other devices or circuits configured to filter the input signal to attenuate third frequency components of the input signal that are outside of a third frequency band, or any combination thereof. In response to the input signal corresponding to a carrier aggregation signal that includes a first carrier signal corresponding to the first frequency range, a second carrier signal corresponding to the second frequency range, and a third carrier signal corresponding to the third frequency range, the first means for filtering may provide the first carrier signal at a first output of the first means for filtering, the second means for filtering may provide the second carrier signal at a second output of the second means for filtering, and the third means for filtering may provide the third carrier signal at a third output of the third means for filtering.

Figure 12:
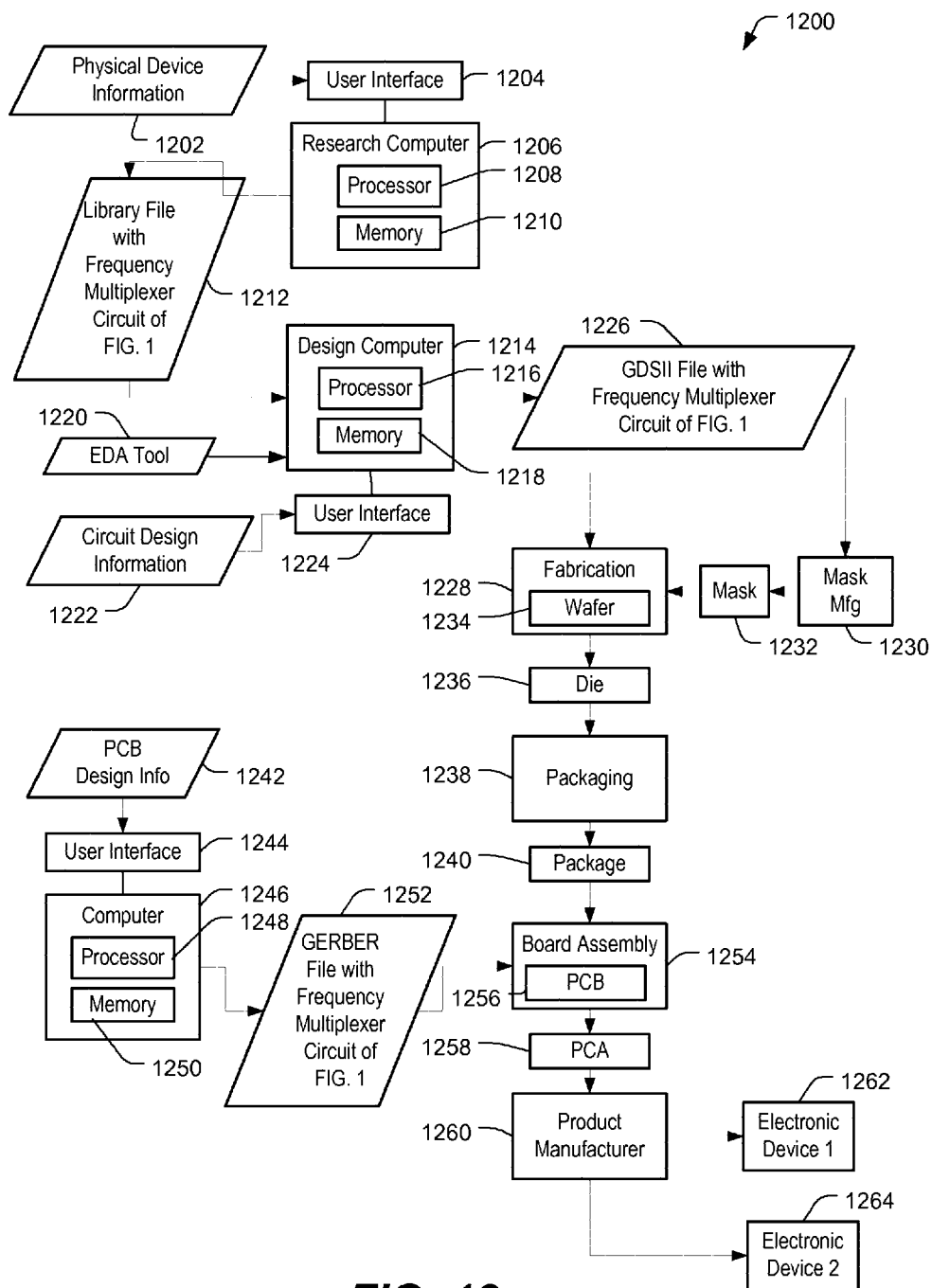
FIG. 12 is a data flow diagram of a particular illustrative embodiment of a manufacturing process to manufacture electronic devices that include the frequency multiplexer device of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 12 depicts a particular illustrative embodiment of an electronic device manufacturing process 1200.

Physical device information 1202 is received at the manufacturing process 1200, such as at a research computer 1206. The physical device information 1202 may include design information representing at least one physical property of a semiconductor device, such as the frequency multiplexer circuit 128 of FIG. 1-FIG. 7. For example, the physical device information 1202 may include physical parameters, material characteristics, and structure information that is entered via a user interface 1204 coupled to the research computer 1206. The research computer 1206 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of semiconductor devices including a device that includes the frequency multiplexer circuit 128 of FIG. 1-FIG. 7, that is provided for use with an electronic design automation (EDA) tool 1220.

The library file 1212 may be used in conjunction with the EDA tool 1220 at a design computer 1214 including a processor 1216, such as one or more processing cores, coupled to a memory 1218. The EDA tool 1220 may be stored as processor executable instructions at the memory 1218 to enable a user of the design computer 1214 to design a circuit including the frequency multiplexer circuit 128 of FIG. 1-FIG. 7, or any combination thereof, of the library file 1212. For example, a user of the design computer 1214 may enter circuit design information 1222 via a user interface 1224 coupled to the design computer 1214. The circuit design information 1222 may include design information representing at least one physical property of a semiconductor device, such as frequency multiplexer circuit 128 of FIG. 1-FIG. 7, or any combination thereof. To illustrate, the circuit design property may include identification of particular circuits and relationships to other elements in a circuit design, positioning information, feature size information, interconnection information, or other information representing a physical property of a semiconductor device.

The design computer 1214 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1214 may be configured to generate a data file including the transformed design information, such as a GDSII file 1226 that includes information describing the frequency multiplexer circuit 128 of FIG. 1-FIG. 7, in addition to other circuits or information. To illustrate, the data file may include information corresponding to a system-on-chip (SOC) that includes the frequency multiplexer circuit 128 of FIG. 1-FIG. 7, and that also includes additional electronic circuits and components within the SOC.

The GDSII file 1226 may be received at a fabrication process 1228 to manufacture the frequency multiplexer circuit 128 of FIG. 1-FIG. 7, or any combination thereof, according to transformed information in the GDSII file 1226. For example, a device manufacture process may include providing the GDSII file 1226 to a mask manufacturer 1230 to create one or more masks, such as masks to be used with photolithography processing, illustrated as a representative mask 1232. The mask 1232 may be used during the fabrication process to generate one or more wafers 1234, which may be tested and separated into dies, such as a representative die 1236. The die 1236 includes a circuit including a device that includes the frequency multiplexer circuit 128 of FIG. 1-FIG. 7, or any combination thereof.

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1246. The computer 1246 may include a processor 1248, such as one or more processing cores, coupled to a memory 1250. A printed circuit board (PCB) tool may be stored as processor executable instructions at the memory 1250 to process PCB design information 1242 received from a user of the computer 1246 via a user interface 1244. The PCB design information 1242 may include physical positioning information of a packaged semiconductor device on a circuit board, the packaged semiconductor device corresponding to the package 1240 including the frequency multiplexer circuit 128 of FIG. 1-FIG. 7, or any combination thereof.

The computer 1246 may be configured to transform the PCB design information 1242 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including the frequency multiplexer circuit 128 of FIG. 1-FIG. 7, or any combination thereof. In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines to perform various steps of a PCB production process. The PCB 1256 may be populated with electronic components including the package 1240 to form a representative printed circuit assembly (PCA) 1258.

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a set top box, a music player, a video player, an entertainment unit, a navigation device, a communications device, a personal digital assistant (PDA), a fixed location data unit, and a computer, into which the frequency multiplexer circuit 128 of FIG. 1-FIG. 7 is integrated. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 12 illustrates remote units according to teachings of the disclosure, the disclosure is not limited to these illustrated units. Embodiments of the disclosure may be suitably employed in any device which includes active integrated circuitry including memory and on-chip circuitry.

A device that includes the frequency multiplexer circuit 128 of FIG. 1-FIG. 7, or any combination thereof, may be fabricated, processed, and incorporated into an electronic device, as described in the illustrative process 1200. One or more aspects of the embodiments disclosed with respect to FIG. 1-FIG. 11 may be included at various processing stages, such as within the library file 1212, the GDSII file 1226, and the GERBER file 1252, as well as stored at the memory 1210 of the research computer 1206, the memory 1218 of the design computer 1214, the memory 1250 of the computer 1246, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. Although various representative stages of production from a physical device design to a final product are depicted, in other embodiments fewer stages may be used or additional stages may be included. Similarly, the process 1200 may be performed by a single entity or by one or more entities performing various stages of the process 1200.

Figure 13:
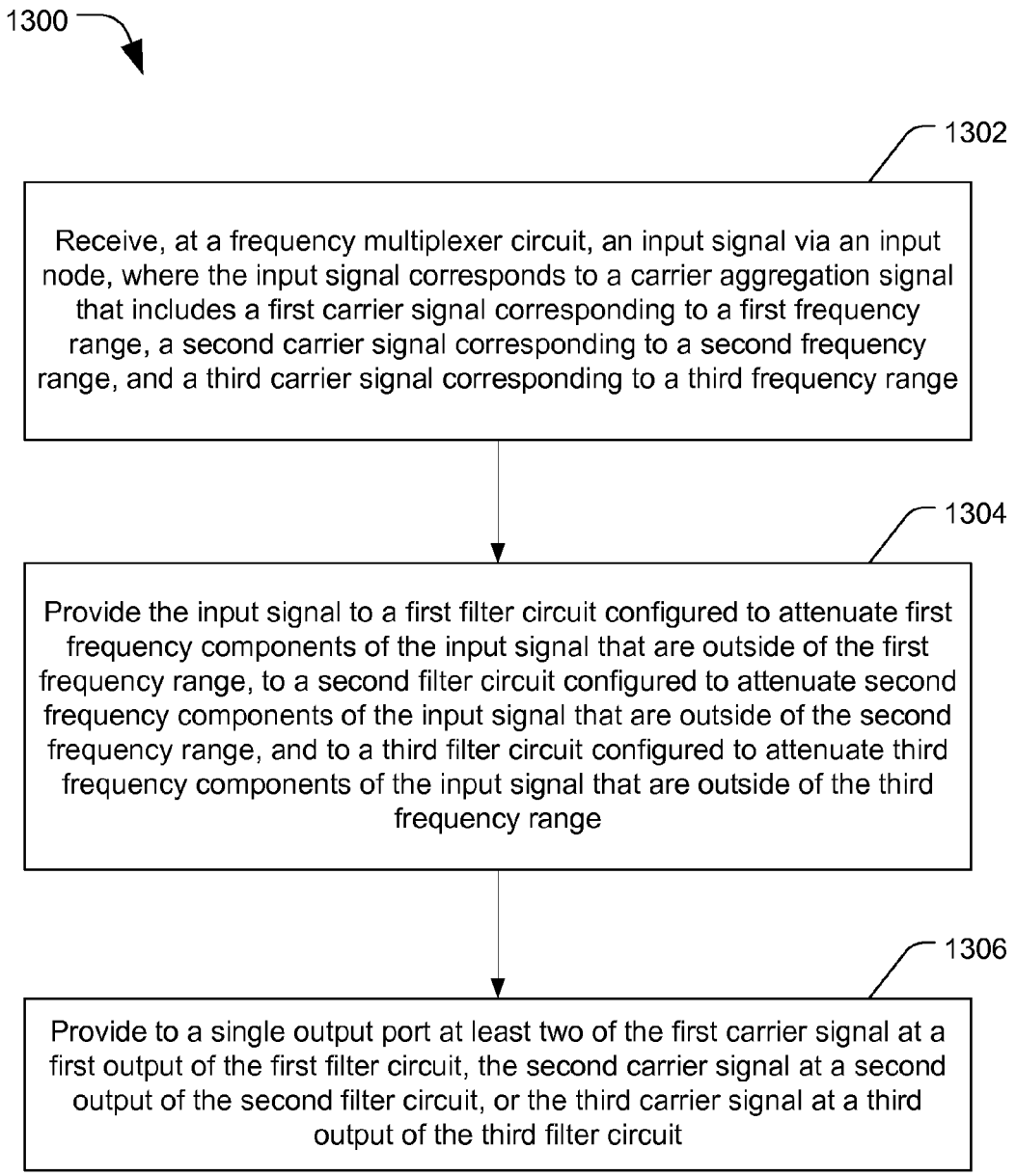
FIG. 13 is a flow chart of a particular illustrative embodiment of a method that may be performed at the frequency multiplexer device of FIG. 1.

FIG. 13 is a flowchart depicting a particular embodiment of a method 1300. The method 1300 may include receiving, at a frequency multiplexer circuit, an input signal via an input node, at 1302. The input signal may correspond to a carrier aggregation signal that includes a first carrier signal corresponding to a first frequency range, a second carrier signal corresponding to a second frequency range, and a third carrier signal corresponding to a third frequency range.

For example, the carrier aggregate signal 118 of FIG. 1 may be received at the frequency multiplexer 128 via the input node 124 of FIG. 1 or FIG. 2.

The method 1300 may further include providing the input signal to a first filter circuit configured to attenuate first frequency components of the input signal that are outside of the first frequency range, to a second filter circuit configured to attenuate second frequency components of the input signal that are outside of the second frequency range, and to a third filter circuit configured to attenuate third frequency components of the input signal that are outside of the third frequency range, at 1304. For example, the carrier aggregated signal 118 of FIG. 1 may be provided to the first filter circuit 142, to the second filter circuit 144, and to the third filter circuit 146.

The method 1300 may also include providing, to a single output port, the first carrier signal at a first output of the first filter circuit, the second carrier signal at a second output of the second filter circuit, or the third carrier signal at a third output of the third filter circuit, at 1306. For example, the recovered first carrier signal 132 of FIG. 1 may be provided at a first output of the first filter circuit 142, the recovered second carrier signal 134 may be provided at a second output of the second filter circuit 144, and the recovered third carrier signal 136 may be provided at a third output of the third filter circuit 146. The switching circuit 220 of FIG. 2 is configurable to provide at least two of the filter outputs 202, such as the second filter output 206 and the third filter output 208, to a single output port (e.g., the third output port 236) of the multiple output ports 232-238.

The method 1300 of FIG. 13 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method of FIG. 13 can be performed by a processor that executes instructions, as described with respect to FIG. 11.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    an antenna configured to receive an input signal and to provide the input signal to an input node, wherein the input signal comprises a carrier aggregation signal;
    a frequency multiplexer circuit coupled to the input node and configured to receive the input signal via the input node, the frequency multiplexer circuit comprising:
        a first filter circuit configured to attenuate first frequency components of the input signal that are outside of a first frequency range that corresponds to a low-band frequency range;
        a second filter circuit configured to attenuate second frequency components of the input signal that are outside of a second frequency range that corresponds to a mid-band frequency range; and
        a third filter circuit configured to attenuate third frequency components of the input signal that are outside of a third frequency range that corresponds to a high-band frequency range;
    a switching circuit that is configurable to receive a first output of the first filter circuit, a second output of the second filter circuit, and a third output of the third filter circuit and to couple the first output to a first output port and the second output and the third output to a single output port configured to output a combined output; and
    a matching circuit coupled to the single output port and selectively coupleable to the second filter circuit and to the third filter circuit, the matching circuit configured to provide a frequency shift to modify a frequency peak of the combined output.

2. The apparatus of claim 1, wherein in response to the input signal corresponding to the carrier aggregation signal that comprises a first carrier signal having a first frequency within the first frequency range, a second carrier signal having a second frequency within the second frequency range, and a third carrier signal having a third frequency within the third frequency range, the frequency multiplexer circuit is configured to provide the first carrier signal at the first output of the first filter circuit, the second carrier signal at the second output of the second filter circuit, and the third carrier signal at the third output of the third filter circuit.

3. The apparatus of claim 1, wherein at least one of the first filter circuit, the second filter circuit, or the third filter circuit comprises an adjustable circuit component.

4. The apparatus of claim 1, wherein the switching circuit is configurable to couple at least one of the first output, the second output, or the third output to a terminal impedance circuit, and wherein the terminal impedance circuit comprises an adjustable component.

5. The apparatus of claim 1, wherein the first filter circuit comprises a low-pass filter, wherein the second filter circuit comprises a band-pass filter, and wherein the third filter circuit comprises a high-pass filter.

6. The apparatus of claim 1, wherein a frequency gap between an upper frequency of the second frequency range and a lower frequency of the third frequency range is less than 200 megahertz.

7. The apparatus of claim 6, wherein a second frequency gap between an upper frequency of the first frequency range and a lower frequency of the second frequency range is greater than 100 megahertz.

8. The apparatus of claim 7, wherein the first frequency range corresponds to a frequency range from 0 hertz to 960 megahertz, wherein the second frequency range corresponds to a frequency range from 1.4 gigahertz to 2.2 gigahertz, and wherein the third frequency range corresponds to a frequency range from 2.3 gigahertz to 2.7 gigahertz.

9. The apparatus of claim 1, wherein the input node is configured to be coupled to the antenna, and further comprising a second frequency multiplexer circuit coupled to a second input node and configured to receive a second input signal from a second antenna via the second input node.

10. The apparatus of claim 1, wherein the frequency multiplexer circuit comprises at least five inductors, wherein at least one inductor of the at least five inductors is formed according to a passive-on-glass fabrication technology, and wherein at least one inductor of the at least five inductors includes a conductive via that extends from a conductive structure disposed on a first surface of a substrate to another conductive structure disposed on a second surface of the substrate.

11. The apparatus of claim 1, wherein the frequency multiplexer circuit is integrated in a device having an area of less than approximately 8 square millimeters and having a height of less than approximately 0.5 millimeters.

12. The apparatus of claim 1, further comprising a fourth filter circuit configured to attenuate fourth frequency components of the input signal that are outside of a fourth frequency range, the fourth filter circuit included in the frequency multiplexer circuit.

13. The apparatus of claim 1 integrated in at least one semiconductor die.

14. The apparatus of claim 1, wherein the combined output comprises a time division duplex signal, wherein in a first mode of operation, the switching circuit is configurable to provide the first output to the first output port, to provide the second output to a second output port, and to provide the third output to a third output port, and wherein in a second mode of operation, the switching circuit is configurable to provide the first output to the first output port and to provide the second output and the third output to the single output port to generate the time division duplex signal.

15. The apparatus of claim 1, wherein in a first mode of operation, the switching circuit is configurable to provide the first output to the first output port, to provide the second output to a second output port, and to provide the third output to a third output port, wherein in the first mode of operation, the first output comprises a first carrier signal corresponding to a low-band LTE signal, wherein the second output comprises a second carrier signal corresponding to a mid-band LTE signal, wherein the third output comprises a third carrier signal corresponding to a high-band LTE signal, and wherein at least one of the first output, the second output, or the third output comprises a frequency division duplex signal.

16. A method comprising:
providing, by an antenna, an input signal to an input node;
receiving, at a frequency multiplexer circuit, the input signal via the input node, wherein the input signal corresponds to a carrier aggregation signal that includes a first carrier signal corresponding to a first frequency range, a second carrier signal corresponding to a second frequency range, and a third carrier signal corresponding to a third frequency range;
providing the input signal to a first filter circuit configured to attenuate first frequency components of the input signal that are outside of the first frequency range that corresponds to a low-band frequency range, to a second filter circuit configured to attenuate second frequency components of the input signal that are outside of the second frequency range that corresponds to a mid-band frequency range, and to a third filter circuit configured to attenuate third frequency components of the input signal that are outside of the third frequency range that corresponds to a high-band frequency range;
receiving, at a switching circuit, the first carrier signal from a first output of the first filter circuit, the second carrier signal from a second output of the second filter circuit, and the third carrier signal from a third output of the third filter circuit; and
providing, by the switching circuit, the first output to a first output port and the second output and the third output to a single output port configured to output a combined output; and
modifying, by a matching circuit coupled to the single output port and selectively couplable to the second filter circuit and to the third filter circuit, a frequency peak of the combined output.

17. The method of claim 16, wherein the providing the input signal to the first filter circuit, providing the input signal to the second filter circuit, and providing the input signal to the third filter circuit are performed responsive to a processor integrated into an electronic device.

18. An apparatus comprising:
means for receiving an input signal and providing the input signal to an input node, wherein the input signal comprises a carrier aggregation signal;
first means for filtering an input signal to attenuate first frequency components of the input signal that are outside of a first frequency range that corresponds to a low-band frequency range;
second means for filtering the input signal to attenuate second frequency components of the input signal that are outside of a second frequency range that corresponds to a mid-band frequency range;
third means for filtering the input signal to attenuate third frequency components of the input signal that are outside of a third frequency range that corresponds to a high-band frequency range;
means for selectively coupling a first output of the first means for filtering to a first output port and a second output of the second means for filtering and a third output of the third means for filtering to a single output port configured to output a combined output, wherein the means for selectively coupling is configured to receive the first output, the second output, and the third output; and means for modifying a frequency peak of the combined output coupled to the single output port and selectively coupleable to the second means for filtering and to the third means for filtering.

19. The apparatus of claim 18, further comprising a communications device, a set top box, a music player, a video player, an entertainment unit, a navigation device, a fixed location data unit, a computer, or a combination thereof, into which the first means for filtering, the second means for filtering, and the third means for filtering are integrated.

20. A non-transitory computer readable medium storing instructions executable by a computer, the instructions comprising:
instructions that are executable by the computer to cause a frequency multiplexer circuit to receive an input signal from an antenna via an input node, wherein the input signal corresponds to a carrier aggregation signal that includes a first carrier signal corresponding to a first frequency range, a second carrier signal corresponding to a second frequency range, and a third carrier signal corresponding to a third frequency range; and
wherein the instructions are executable by the computer to cause the input signal to be provided to a first filter circuit configured to attenuate first frequency components of the input signal that are outside of the first frequency range that corresponds to a low-band frequency range, to a second filter circuit configured to attenuate second frequency components of the input signal that are outside of the second frequency range that corresponds to a mid-band frequency range, and to a third filter circuit configured to attenuate third frequency components of the input signal that are outside of the third frequency range that corresponds to a high-band frequency range;
wherein the instructions are executable by the computer to cause a switching circuit to receive the first carrier signal that is provided from a first output of the first filter circuit, the second carrier signal that is provided from a second output of the second filter circuit, and the third carrier signal that is provided from a third output of the third filter circuit; and
wherein the instructions are executable by the computer to cause the switching circuit to provide the first output to a first output port and the second output and the third output to a single output port configured to output a combined output and
wherein the instructions are executable by the computer to cause a matching circuit coupled to the single output port and selectively coupleable to the second filter circuit and to the third filter circuit to modify a frequency peak of the combined output.

21. The non-transitory computer readable medium of claim 20, wherein the instructions are executable by a processor integrated in a communications device, a set top box, a music player, a video player, an entertainment unit, a navigation device, a fixed location data unit, a computer, or a combination thereof.

22. An apparatus comprising:
an antenna configured to provide a carrier aggregation signal to an input node;
a frequency multiplexer circuit coupled to the input node and configured to receive the carrier aggregation signal via the input node, the frequency multiplexer circuit comprising:
a first filter circuit configured to attenuate first frequency components of the carrier aggregation signal that are outside of a first frequency range that corresponds to a low-band frequency range;
a second filter circuit configured to attenuate second frequency components of the carrier aggregation signal that are outside of a second frequency range that corresponds to a mid-band frequency range; and
a third filter circuit configured to attenuate third frequency components of the carrier aggregation signal that are outside of a third frequency range that corresponds to a high-band frequency range;
a switching circuit that is configured to receive a first carrier signal from the first filter circuit, a second carrier signal from the second filter circuit, and a third carrier signal from the third filter circuit and configurable to couple the first carrier signal to a first output port and the second carrier signal and the third carrier signal to a single output port configured to output a combined output, wherein first carrier signal corresponds to a low-band LTE signal, and wherein the combined output corresponds to a second LTE signal; and
a matching circuit coupled to the single output port and selectively coupleable to the second filter circuit and to the third filter circuit, the matching circuit configured to provide a frequency shift to modify a frequency peak of the combined output.

23. The apparatus of claim 22, wherein the combined output comprises a time division duplex signal, and wherein the time division duplex signal has a fourth frequency within a fourth frequency range, and wherein the fourth frequency range includes the second frequency range and the third frequency range.

24. The apparatus of claim 22, wherein the switching circuit is configurable to, in a triplexer mode, couple the first carrier signal to the first output port, the second carrier signal to a second output port, and the third carrier signal to a third output port, and wherein, when the switching circuit is in the triplexer mode, the second carrier signal corresponds to a mid-band LTE signal and the third carrier signal corresponds to a high-band LTE signal.

* * * * *